(12) United States Patent
Spalt et al.

(10) Patent No.: US 11,641,107 B2
(45) Date of Patent: May 2, 2023

(54) DISTANCE-TO-FAULT POWER OUTAGE NOTIFICATION

(71) Applicant: Utilidata, Inc., Providence, RI (US)

(72) Inventors: Taylor Spalt, Providence, RI (US); Ning Li, Mansfield, MA (US); Marissa Hummon, Golden, CO (US)

(73) Assignee: UTILIDATA, INC., Providence, RI (US)

( * ) Notice: Subject to any disclaimer, the term of this patent is extended or adjusted under 35 U.S.C. 154(b) by 0 days.

(21) Appl. No.: 17/840,290

(22) Filed: Jun. 14, 2022

(65) Prior Publication Data

US 2022/0399718 A1 Dec. 15, 2022

Related U.S. Application Data

(60) Provisional application No. 63/210,625, filed on Jun. 15, 2021.

(51) Int. Cl.
*H02J 3/00* (2006.01)
*H02J 13/00* (2006.01)
*G08B 21/18* (2006.01)

(52) U.S. Cl.
CPC .......... *H02J 3/0012* (2020.01); *G08B 21/182* (2013.01); *G08B 21/185* (2013.01); *H02J 13/00002* (2020.01)

(58) Field of Classification Search
CPC ................. G08B 21/182; G08B 21/185; H02J 13/00002; H02J 3/0012
See application file for complete search history.

(56) References Cited

U.S. PATENT DOCUMENTS

| 7,179,270 B2 | 2/2007 | Makower |
| 8,437,883 B2 | 5/2013 | Powell et al. |

(Continued)

FOREIGN PATENT DOCUMENTS

| CN | 104156881 A | 11/2014 |
| CN | 104166940 A | 11/2014 |

(Continued)

OTHER PUBLICATIONS

Isaacson, Jerry, Ph.D. et al., "Ignyta, Inc.: Initiation of Coverage," LifeSci Advisors Research, Feb. 14, 2014, pp. 1-37.

(Continued)

*Primary Examiner* — Quan Zhen Wang
*Assistant Examiner* — Rajsheed O Black-Childress
(74) *Attorney, Agent, or Firm* — Foley & Lardner LLP

(57) ABSTRACT

Systems and methods comprising a metering device located on an electricity distribution grid, the metering device comprising one or more processors and memory. The metering device can detect a drop in characteristic of electricity below a threshold indicating a fault on the electricity distribution grid. The metering device can generate, responsive to the drop in the characteristic of electricity below the threshold, a time series of a rate of change of the characteristic of electricity for a predetermined number of cycles subsequent to the detection of the drop. The metering device can determine, based on a comparison of the time series of the rate of change with a predetermined pattern, a location of the metering device on the electricity distribution grid relative to a location of the fault on the electricity distribution grid.

20 Claims, 8 Drawing Sheets

(56) References Cited

U.S. PATENT DOCUMENTS

| | | |
|---|---|---|
| 8,577,510 B2 | 11/2013 | Powell et al. |
| 10,393,793 B1 | 8/2019 | Nguyen et al. |
| 11,183,878 B2 | 11/2021 | Kuloor et al. |
| 11,245,260 B2 | 2/2022 | Davis |
| 11,515,725 B2 | 11/2022 | Toulgoat-Dubois et al. |
| 2002/0063621 A1 | 5/2002 | Tseng et al. |
| 2007/0183369 A1 | 8/2007 | Angelis |
| 2008/0243067 A1 | 10/2008 | Rottenberg et al. |
| 2008/0249397 A1 | 10/2008 | Kapadia |
| 2009/0088685 A1 | 4/2009 | Kugler et al. |
| 2009/0124899 A1 | 5/2009 | Jacobs et al. |
| 2009/0281679 A1 | 11/2009 | Taft et al. |
| 2010/0063534 A1 | 3/2010 | Kugler et al. |
| 2012/0086459 A1 | 4/2012 | Kim |
| 2014/0265574 A1 | 9/2014 | Tyler et al. |
| 2014/0277796 A1 | 9/2014 | Peskin et al. |
| 2014/0277813 A1 | 9/2014 | Powell et al. |
| 2014/0277814 A1 | 9/2014 | Hall et al. |
| 2014/0312693 A2 | 10/2014 | Powell et al. |
| 2017/0336444 A1 | 11/2017 | Sela |
| 2018/0054063 A1 | 2/2018 | Parashar et al. |
| 2019/0011920 A1 | 1/2019 | Heinonen et al. |
| 2020/0292608 A1 | 9/2020 | Yan et al. |
| 2020/0401138 A1 | 12/2020 | Rentz et al. |
| 2021/0325441 A1* | 10/2021 | Léonard ............... G01R 31/088 |
| 2022/0037948 A1 | 2/2022 | Jo et al. |
| 2022/0149623 A1 | 5/2022 | Davis |
| 2022/0285980 A1 | 9/2022 | Radgowski |

FOREIGN PATENT DOCUMENTS

| | | |
|---|---|---|
| WO | WO-2016/176064 A1 | 11/2016 |
| WO | WO-2019/032761 A1 | 2/2019 |
| WO | WO-2022/060808 A1 | 3/2022 |
| WO | WO-2022/187669 A1 | 9/2022 |

OTHER PUBLICATIONS

CN Office Action on CN Appl. Ser. No. 201680073076.4 dated Jan. 6, 2023 (5 pages).

International Search Report and The Written Opinion of the International Searching Authority re PCT/US22/33447 dated Sep. 6, 2022.

International Search Report and Written Opinion on PCT Appn. PCT/US2022/018973 dated Jul. 12, 2022.

International Search Report on PCT Appln PCT/US2018/045892 dated Oct. 31, 2018.

Isaacson et al., "Ignyta, Inc.: Initiation of Coverage," LifeSci Advisors Research, Feb. 14, 2014, pp. 1-37.

* cited by examiner

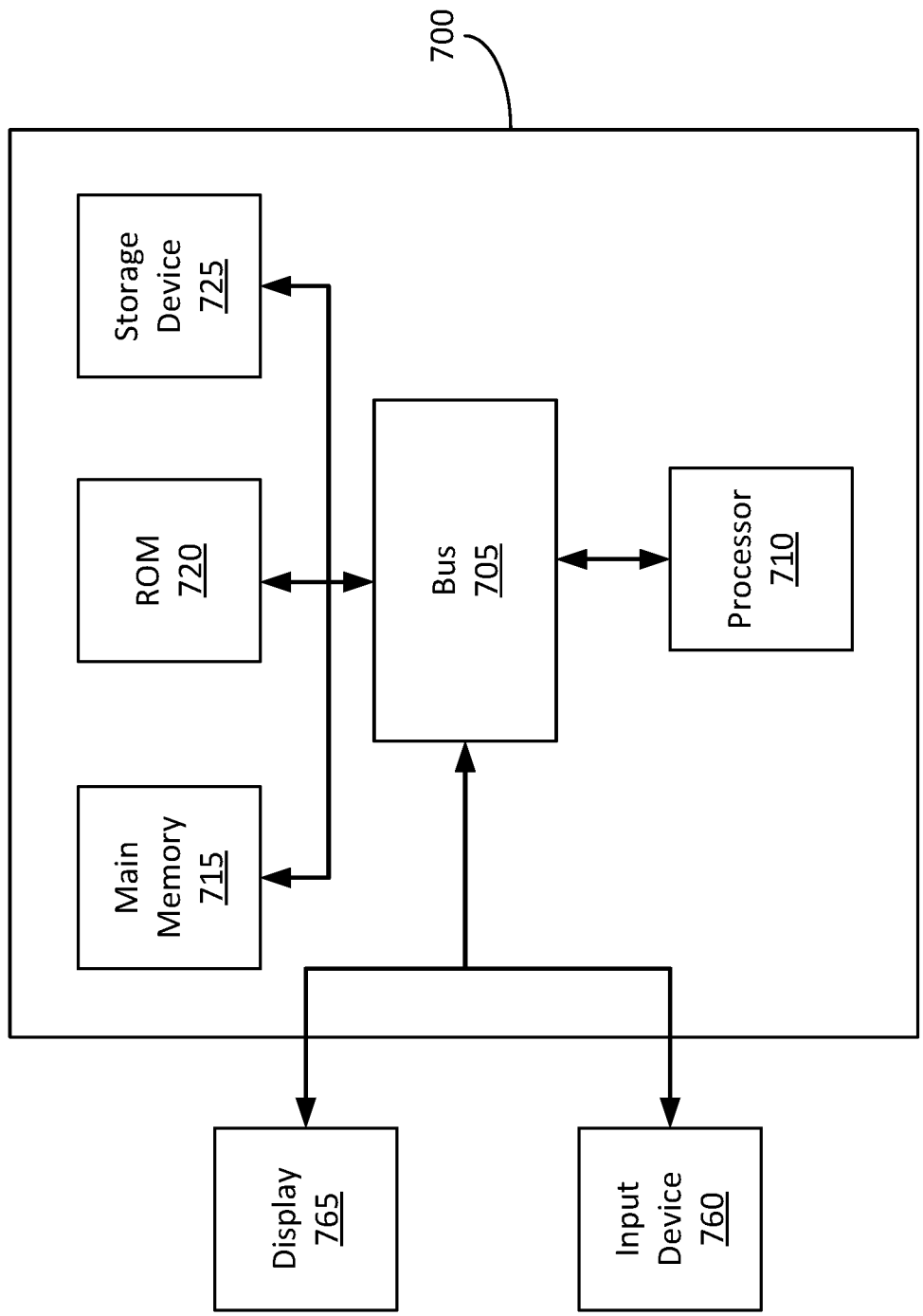

DISTANCE-TO-FAULT POWER OUTAGE NOTIFICATION

CROSS-REFERENCE TO RELATED APPLICATIONS

This application claims the benefit of priority under 35 U.S.C. § 119 to U.S. Provisional Patent Application No. 63/210,625, filed Jun. 15, 2021, which is hereby incorporated by reference herein in its entirety.

FIELD OF THE DISCLOSURE

This disclosure relates generally to systems and methods for detecting outages within a utility grid. In particular, the systems and methods of this disclosure can locate the epicenter of the outage among metering devices that lost power.

BACKGROUND

Utility distribution grids can use meters to observe or measure utility delivery or consumption in the grid. These meters, among other components within utility distribution grids can experience power outages for various reasons. Power outages in utility distribution grids negatively affect their reliability scores (e.g., the Customer Average Interruption Duration Index ("CAIDI")). However, it can be challenging to efficiently and accurately locate and repair faults when they occur.

BRIEF SUMMARY OF THE DISCLOSURE

Systems and methods of this disclosure are directed to locating a fault within a utility grid. Some utility grids may wait for their customers to report a power outage within their area, either via an online web portal or application. In some cases, the utility grids use phone calls from customers to identify an outage. Some other utility grids may use an advance metering infrastructure ("AMI") as a "last gasp" or "dying gasp" messaging system to receive a reporting of electrical outages. For example, when a metering device (e.g., customer metering device) senses or detects that the voltage has dropped below a predetermined (or set) threshold for a predetermined amount of time (e.g., set by an operator of the utility grid or the metering device), the metering device can transmit a message (sometimes referred to as a gasp, last gasp, dying gasp, or Power Outage Notification ("PON")) to the utility Outage Management System ("OMS"). The message can include the metering device identifier ("ID") and a timestamp indicating a time when the voltage of the metering device dropped below the predetermined threshold. By transmitting PON, the OMS may identify or map which metering devices experienced the outage. Being able to locate the closest metering device to a fault could greatly decrease the time spent searching for a fault thereby increasing reliability and decreasing customer downtime. However, it may be challenging to determine the epicenter or the source of the power outages within the utility grid with only the use of PON, hence, delaying the time to repair physical issues or restore power within the utility grid.

The systems and methods of this disclosure can include a data processing system configured to determine the location of at least one fault (e.g., electrical fault or outage) using information or signals received from metering devices on the grid. For example, the metering devices can sample an analog signal, such as a characteristic of electricity (e.g., voltage or current), at a sample rate (e.g., 500 Hz, 1 KHz, 1.5 Khz, 2 Khz, or more). Each metering device can compute at least one respective value associated with the characteristic of electricity during an outage, such as a rate of change when the electrical characteristic is less than or equal to a threshold (e.g., PON threshold). In some cases, the metering device may generate and transmit a time series including values of the rate of change to the data processing system. The data processing system can plot the values (e.g., rate of changes) from individual metering devices on a map to generate a time series (e.g., at least one value from each metering device). The time series can indicate the rate of change of the characteristic of electricity from the metering devices. The data processing system can compare the characteristics (e.g., slopes) of the time series with patterns (or based on the time series itself) to determine if each metering device is upstream of, downstream of, or relatively near the fault location, based on similarities or matches between the characteristics and one or more patterns. For example, a first set of patterns can include slopes representing that the metering device is upstream, and a second set of patterns can include slopes representing that the metering device is downstream. These patterns can be generated based on historical data. These patterns may be generated based on physics-inferred characteristics of electricity, for example, of various metering devices during an outage or fault. If the time series include characteristics similar to the pattern of the first set, the data processing system can determine that the metering device is located upstream of the fault. If the time series include characteristics similar to the pattern of the second set, the data processing system can determine that the metering device is located downstream of the fault.

As such, by utilizing the characteristics of electricities from the distributed metering devices and comparing the characteristics to one or more patterns, the data processing system can determine the relative distance of the metering devices to the fault. Thus, the systems and methods can provide a technical solution in locating the fault relative to the metering device location, thereby reducing the time to restore services (e.g., electrical utilities or distribution), decreasing the CAIDI score, and improving customer satisfaction.

In one aspect, this disclosure is directed to a method for locating a fault within a utility grid. The method can include detecting, by a metering device located on an electricity distribution grid, a drop in characteristic of electricity below a threshold indicating a fault on the electricity distribution grid. The method can include generating, by the metering device responsive to the drop in the characteristic of electricity below the threshold, a time series of a rate of change of the characteristic of electricity for a predetermined number of cycles subsequent to the detection of the drop. The method can include determining, by at least one of the metering device or one or more processors in communication with the metering device, based on a comparison of the time series of the rate of change with a predetermined pattern, a location of the metering device on the electricity distribution grid relative to a location of the fault on the electricity distribution grid.

The characteristic of electricity can correspond to a characteristic of voltage measured by the metering device. In some cases, the characteristic of electricity can correspond to a characteristic of current measured by the metering device. In some cases, the method can include triggering, by the metering device, responsive to the detected drop in the characteristic of electricity, a power outage notification (PON). The method can include generating, by the metering device, responsive to the triggered PON, the time series of the rate of change of the characteristic of electricity for the predetermined number of cycles.

The method can include determining, by the metering device, the rate of change of the characteristic of electricity based on a derivative in time of a root mean square (RMS) of one of a voltage signal or a current signal. In some cases, the predetermined pattern can include at least an incline slope and a decline slope. A declination of the decline slope can be greater than an inclination of the incline slope. The method can include determining, by the metering device, that the location of the metering device is downstream a first subset of metering devices and upstream a second subset of metering devices based on the predetermined pattern. The incline slope can be associated with the first subset of metering devices upstream of the location of the metering device. The decline slope can be associated with the second metering device downstream of the location of the metering device.

The electricity distribution grid can include a second metering device located at a different location from the metering device. The method can include detecting, by the second metering device, a second drop in the characteristic of electricity below the threshold indicating the fault on the electricity distribution grid. The method can include generating, by the second metering device responsive to the second drop in the characteristic of electricity below the threshold, a second time series of a second rate of change of the characteristic of electricity for the predetermined number of cycles subsequent to the detection of the second drop. The method can include determining, by the second metering device, based on a second comparison of the second time series of the second rate of change with the predetermined pattern, a location of the second metering device on the electricity distribution grid relative to the location of the fault on the electricity distribution grid.

The method can include providing, by the metering device, via a network, an indication of the location of at least one of the second metering device or the fault on the electricity distribution grid to a computing system comprising one or more processors coupled to memory. In some cases, the method can include receiving, by a computing system, a plurality of time series of rates of change generated by a plurality of metering devices located on the electricity distribution grid responsive to drops in characteristics of electricity. The method can include normalizing, by the computing system, values of the plurality of time series. The method can include determining, by the computing system, based on the normalized values of the plurality of time series, a likelihood of fault location at each of the plurality of metering devices. The method can include determining, by the computing system, that the fault is upstream of a first metering device and downstream of a second metering device based on the likelihood.

In another aspect, this disclosure is directed to a system for locating a fault within a utility grid. The system can include a metering device located on an electricity distribution grid, the metering device comprising one or more processors and memory. The metering device can detect a drop in characteristic of electricity below a threshold indicating a fault on the electricity distribution grid. The metering device can generate, responsive to the drop in the characteristic of electricity below the threshold, a time series of a rate of change of the characteristic of electricity for a predetermined number of cycles subsequent to the detection of the drop. The metering device can determine, based on a comparison of the time series of the rate of change with a predetermined pattern, a location of the metering device on the electricity distribution grid relative to a location of the fault on the electricity distribution grid.

The characteristic of electricity can correspond to a characteristic of voltage measured by the metering device. In some cases, the characteristic of electricity can correspond to a characteristic of current measured by the metering device. In some cases, the metering device can trigger, responsive to the detected drop in the characteristic of electricity, a power outage notification (PON). The metering device can generate, responsive to the triggered PON, the time series of the rate of change of the characteristic of electricity for the predetermined number of cycles.

The metering device can determine, the rate of change of the characteristic of electricity based on a derivative in time of a root mean square (RMS) of one of a voltage signal or a current signal. In some cases, the predetermined pattern can include at least an incline slope and a decline slope, wherein a declination of the decline slope is greater than an inclination of the incline slope. The metering device can determine, that the location of the metering device is downstream a first subset of metering devices and upstream a second subset of metering devices based on the predetermined pattern, wherein the incline slope is associated with the first subset of metering devices upstream of the location of the metering device, and wherein the decline slope is associated with the second metering device downstream of the location of the metering device.

The electricity distribution grid can include a second metering device located at a different location from the metering device. The second metering device can detect a second drop in the characteristic of electricity below the threshold indicating the fault on the electricity distribution grid. The second metering device can generate, responsive to the second drop in the characteristic of electricity below the threshold, a second time series of a second rate of change of the characteristic of electricity for the predetermined number of cycles subsequent to the detection of the second drop. The second metering device can determine, based on a second comparison of the second time series of the second rate of change with the predetermined pattern, a location of the second metering device on the electricity distribution grid relative to the location of the fault on the electricity distribution grid.

In another aspect, this disclosure is directed to a non-transitory computer readable storage medium locating a fault within a utility grid. The non-transitory computer readable storage medium can store instructions that, when executed by the one or more processors of a computing system, cause the one or more processors to receive a plurality of time series of rates of change generated by a plurality of metering devices located on an electricity distribution grid responsive to drops in characteristics of electricity. The one or more processors can normalize values of the plurality of time series. The one or more processors can determine, based on the normalized values of the plurality of time series, a likelihood of fault location at each of the plurality of metering devices. The one or more processors can determine that a fault is upstream of a first metering device and downstream of a second metering device based on the likelihood. The one or more processors can provide, responsive to the determination, an indication of a location of the fault upstream of the first metering device and downstream of the second metering device.

The one or more processors can provide the indication of the location of the fault to a device remote from the computing system to facilitate repair of the fault.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE FIGURES

The accompanying drawings are not intended to be drawn to scale. Like reference numbers and designations in the various drawings indicate like elements having similar structure or functionality. For purposes of clarity, not every component may be labeled in every drawing. In the drawings:

FIG. 7 is a block diagram illustrating an architecture for a computer system that can be employed to implement elements of the systems and methods described and illustrated herein, including, for example, aspects of the utility grid depicted in FIG. 1, the systems depicted in FIG. 2, and the operations depicted in FIGS. 3-6.

Figure 1:
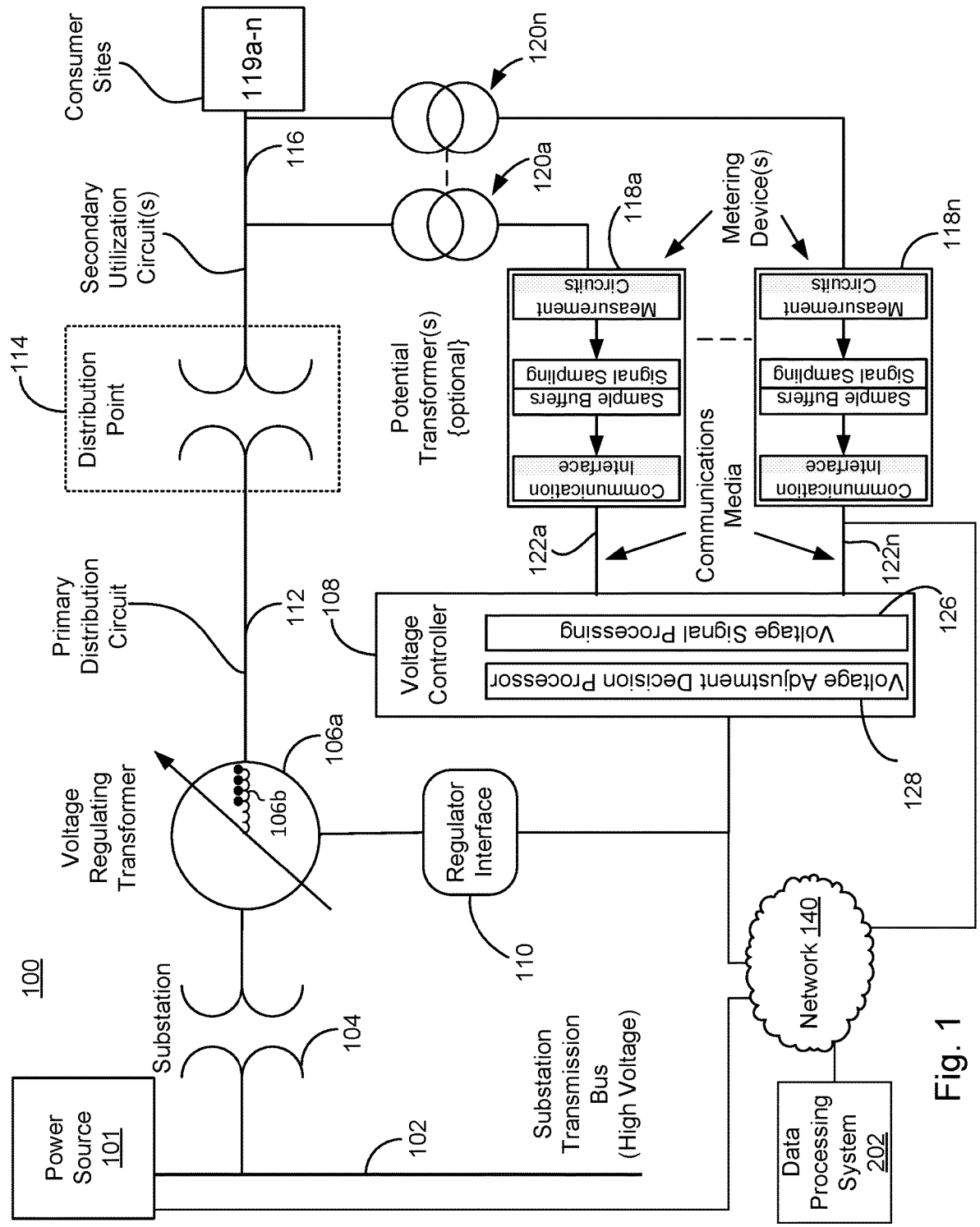
FIG. 1 is a block diagram depicting an illustrative utility grid, in accordance with an implementation.

The features and advantages of the present solution will become more apparent from the detailed description set forth below when taken in conjunction with the drawings, in which like reference characters identify corresponding elements throughout. Other features, aspects, and advantages of the subject matter will become apparent from the description, the drawings, and the claims.

DETAILED DESCRIPTION

Following below are more detailed descriptions of various concepts related to, and implementations of, methods, apparatuses, and systems of locating a fault within a utility grid. The various concepts introduced above and discussed in greater detail below may be implemented in any of numerous ways.

A utility grid, or utility distribution system, can distribute electricity. A system that manages the utility grid can locate the epicenter or the source of the fault or power outages relative to metering devices (e.g., meters, adapters, smart grid chips, or other electrical measuring devices) within the utility grid based on measurements from the metering devices, such as the analog voltage waveforms. Each metering device can determine at least one rate of change when a predetermined condition is triggered, such as before, at, or after a PON is triggered. Each metering device may generate a time series including values the rate of changes during the drop in electricity (e.g., from PON start to PON end). In some cases, the system can receive the measurements from individual metering devices and compute the rate of changes (e.g., a respective value associated with each metering device) based on the measurements. The system can plot the computed rate of changes from various metering devices (e.g., at least one value associated with the time series from each metering device) on a map to generate a time series. The time series can include characteristics (e.g., slopes, patterns, behavior, or waveforms) of electricity during the outage. The system can compare the time series (or characteristics of the time series) to patterns (e.g., determined based on historical data of the metering devices during outages or based on physics-inferred electrical characteristics calculated or determined for metering devices relative to the fault location) of electrical (e.g., voltage or current) behavior. Based on the comparison including similarities to one or more patterns, the system can determine the locations of the metering devices relative to a fault location (e.g., the epicenter of the outage), such as upstream, downstream, or relatively near the fault location. Thus, the system can locate the epicenter of the outage, such as located downstream from one or more metering devices associated with the first pattern or upstream from one or more metering devices associated with the second pattern, thereby reducing the time to restore services (e.g., electrical utilities or distribution), decreasing the CAIDI score, and improving customer satisfaction from less interruption in the distribution services.

Referring now to FIG. 1, an example utility distribution environment is shown. The utility distribution environment can include a utility grid 100. The utility grid 100 can include an electricity distribution grid with one or more devices, assets, or digital computational devices and systems, such as a computing device 700 or a data processing system 202 (e.g., in conjunction with FIG. 2). In brief overview, the utility grid 100 includes a power source 101 that can be connected via a subsystem transmission bus 102 and/or via substation transformer 104 to a voltage regulating transformer 106a. The voltage regulating transformer 106a can be controlled by voltage controller 108 with regulator interface 110. Voltage regulating transformer 106a can be optionally coupled on primary distribution circuit 112 via optional distribution transformer 114 to secondary utilization circuits 116 and to one or more electrical or electronic devices 119. Voltage regulating transformer 106a can include multiple tap outputs 106b with each tap output 106b supplying electricity with a different voltage level. The utility grid 100 can include monitoring devices 118a-118n that can be coupled through optional potential transformers 120a-120n to secondary utilization circuits 116. The monitoring or metering devices 118a-118n can detect (e.g., continuously, periodically, based on a time interval, responsive to an event or trigger) measurements and continuous voltage signals of electricity supplied to one or more electrical devices 119 connected to circuit 112 or 116 from a power source 101 coupled to bus 102. A voltage controller 108 can receive, via a communication media 122, measurements obtained by the metering devices 118a-118n, and use the measurements to make a determination regarding a voltage tap settings, and provide an indication to regulator interface 110. The regulator interface can communicate with voltage regulating transformer 106a to adjust an output tap level 106b.

Still referring to FIG. 1, and in further detail, the utility grid 100 includes a power source 101. The power source 101 can include a power plant such as an installation configured to generate electrical power for distribution. The power source 101 can include an engine or other apparatus that generates electrical power. The power source 101 can create electrical power by converting power or energy from one state to another state. In some embodiments, the power source 101 can be referred to or include a power plant, power station, generating station, powerhouse or generating plant. In some embodiments, the power source 101 can include a generator, such as a rotating machine that converts mechanical power into electrical power by creating relative motion between a magnetic field and a conductor. The power source 101 can use one or more energy source to turn the generator including, e.g., fossil fuels such as coal, oil, and natural gas, nuclear power, or cleaner renewable sources such as solar, wind, wave and hydroelectric.

In some embodiments, the utility grid 100 includes one or more substation transmission bus 102. The substation transmission bus 102 can include or refer to transmission tower, such as a structure (e.g., a steel lattice tower, concrete, wood, etc.), that supports an overhead power line used to distribute electricity from a power source 101 to a substation 104 or distribution point 114. Transmission towers 102 can be used in high-voltage AC and DC systems, and come in a wide variety of shapes and sizes. In an illustrative example, a transmission tower can range in height from 15 to 55 metering devices or more. Transmission towers 102 can be of various types including, e.g., suspension, terminal, tension, and transposition. In some embodiments, the utility grid 100 can include underground power lines in addition to or instead of transmission towers 102.

In some embodiments, the utility grid 100 includes a substation 104 or electrical substation 104 or substation transformer 104. A substation can be part of an electrical generation, transmission, and distribution system. In some embodiments, the substation 104 transform voltage from high to low, or the reverse, or performs any of several other functions to facilitate the distribution of electricity. In some embodiments, the utility grid 100 can include several substations 104 between the power plant 101 and the consumer electoral devices 119 with electric power flowing through them at different voltage levels.

The substations 104 can be remotely operated, supervised and controlled (e.g., via a supervisory control and data acquisition system or data processing system 202). A substation can include one or more transformers to change voltage levels between high transmission voltages and lower distribution voltages, or at the interconnection of two different transmission voltages.

The regulating transformer 106 can include: (1) a multi-tap autotransformer (single or three phase), which are used for distribution; or (2) on-load tap changer (three phase transformer), which can be integrated into a substation transformer 104 and used for both transmission and distribution. The illustrated system described herein can be implemented as either a single-phase or three-phase distribution system. The utility grid 100 can include an alternating current (AC) power distribution system and the term voltage can refer to an "RMS Voltage", in some embodiments.

The utility grid 100 can include a distribution point 114 or distribution transformer 114, which can refer to an electric power distribution system. In some embodiments, the distribution point 114 can be a final or near final stage in the delivery of electric power. For example, the distribution point 114 can carry electricity from the transmission system (which can include one or more transmission towers 102) to individual consumers 119. In some embodiments, the distribution system can include the substations 104 and connect to the transmission system to lower the transmission voltage to medium voltage ranging between 2 kV and 35 kV with the use of transformers, for example. Primary distribution lines or circuit 112 carry this medium voltage power to distribution transformers located near the customer's premises 119. Distribution transformers can further lower the voltage to the utilization voltage of appliances and can feed several customers 119 through secondary distribution lines or circuits 116 at this voltage. Commercial and residential customers 119 can be connected to the secondary distribution lines through service drops. In some embodiments, customers demanding high load can be connected directly at the primary distribution level or the sub-transmission level.

The utility grid 100 can include or couple to one or more consumer sites 119. Consumer sites 119 can include, for example, a building, house, shopping mall, factory, office building, residential building, commercial building, stadium, movie theater, etc. The consumer sites 119 can be configured to receive electricity from the distribution point 114 via a power line (above ground or underground). A consumer site 119 can be coupled to the distribution point 114 via a power line. The consumer site 119 can be further coupled to a site metering device 118a-n or advanced metering infrastructure ("AMI"). The site metering device 118a-n can be associated with a controllable primary circuit segment 112. The association can be stored as a pointer, link, field, data record, or other indicator in a data file in a database.

The utility grid 100 can include site metering devices 118a-n or AMI. Site metering devices 118a-n can measure, collect, and analyze energy usage, and communicate with metering devices such as electricity meters, gas meters, heat meters, and water meters, either on request or on a schedule. Site metering devices 118a-n can include hardware, software, communications, consumer energy displays and controllers, customer associated systems, Meter Data Management (MDM) software, or supplier business systems. In some embodiments, the site metering devices 118a-n can obtain samples of electricity usage in real time or based on a time interval, and convey, transmit or otherwise provide the information. In some embodiments, the information collected by the site metering device 118a-n can be referred to as meter observations or metering observations and can include the samples of electricity usage. In some embodiments, the site metering device 118a-n can convey the metering observations along with additional information such as a unique identifier of the site metering device 118a-n, unique identifier of the consumer, a time stamp, date stamp, temperature reading, humidity reading, ambient temperature reading, etc. In some embodiments, each consumer site 119 (or electronic device) can include or be coupled to a corresponding site metering device or monitoring device 118a-118n.

Monitoring devices 118a-118n can be coupled through communications media 122a-122n to voltage controller 108. Voltage controller 108 can compute (e.g., discrete-time, continuously or based on a time interval or responsive to a condition/event) values for electricity that facilitates regulating or controlling electricity supplied or provided via the utility grid. For example, the voltage controller 108 can compute estimated deviant voltage levels that the supplied electricity (e.g., supplied from power source 101) will not drop below or exceed as a result of varying electrical consumption by the one or more electrical devices 119. The deviant voltage levels can be computed based on a predetermined confidence level and the detected measurements. Voltage controller 108 can include a voltage signal processing circuit 126 that receives sampled signals from metering devices 118a-118n. Metering devices 118a-118n can process and sample the voltage signals such that the sampled voltage signals are sampled as a time series (e.g., uniform time series free of spectral aliases or non-uniform time series).

Voltage signal processing circuit 126 can receive signals via communications media 122a-n from metering devices 118a-n, process the signals, and feed them to voltage adjustment decision processor circuit 128. Although the term "circuit" is used in this description, the term is not meant to limit this disclosure to a particular type of hardware or design, and other terms known generally known such as the term "element", "hardware", "device" or "apparatus" could be used synonymously with or in place of term "circuit" and can perform the same function. For example, in some embodiments the functionality can be carried out using one or more digital processors, e.g., implementing one or more digital signal processing algorithms. Adjustment decision processor circuit 128 can determine a voltage location with respect to a defined decision boundary and set the tap position and settings in response to the determined location. For example, the adjustment decision processing circuit 128 in voltage controller 108 can compute a deviant voltage level that is used to adjust the voltage level output of electricity supplied to the electrical device. Thus, one of the multiple tap settings of regulating transformer 106 can be continuously selected by voltage controller 108 via regulator interface 110 to supply electricity to the one or more electrical devices based on the computed deviant voltage level. The voltage controller 108 can also receive information about voltage regulator transformer 106a or output tap settings 106b via the regulator interface 110. Regulator interface 110 can include a processor controlled circuit for selecting one of the multiple tap settings in voltage regulating transformer 106 in response to an indication signal from voltage controller 108. As the computed deviant voltage level changes, other tap settings 106b (or settings) of regulating transformer 106a are selected by voltage controller 108 to change the voltage level of the electricity supplied to the one or more electrical devices 119.

The network 140 can be connected via wired or wireless links. Wired links can include Digital Subscriber Line (DSL), coaxial cable lines, or optical fiber lines. The wireless links can include BLUETOOTH, Wi-Fi, Worldwide Interoperability for Microwave Access (WiMAX), an infrared channel or satellite band. The wireless links can also include any cellular network standards used to communicate among mobile devices, including standards that qualify as 1G, 2G, 3G, or 4G. The network standards can qualify as one or more generation of mobile telecommunication standards by fulfilling a specification or standards such as the specifications maintained by International Telecommunication Union. The 3G standards, for example, can correspond to the International Mobile Telecommunications-2000 (IMT-2000) specification, and the 4G standards can correspond to the International Mobile Telecommunications Advanced (IMT-Advanced) specification. Examples of cellular network standards include AMPS, GSM, GPRS, UMTS, LTE, LTE Advanced, Mobile WiMAX, and WiMAX-Advanced. Cellular network standards can use various channel access methods e.g. FDMA, TDMA, CDMA, or SDMA. In some embodiments, different types of data can be transmitted via different links and standards. In other embodiments, the same types of data can be transmitted via different links and standards.

The network 140 can be any type and/or form of network. The geographical scope of the network 140 can vary widely and the network 140 can be a body area network (BAN), a personal area network (PAN), a local-area network (LAN), e.g. Intranet, a metropolitan area network (MAN), a wide area network (WAN), or the Internet. The topology of the network 140 can be of any form and can include, e.g., any of the following: point-to-point, bus, star, ring, mesh, or tree. The network 140 can be an overlay network which is virtual and sits on top of one or more layers of other networks 140. The network 140 can be of any such network topology as known to those ordinarily skilled in the art capable of supporting the operations described herein. The network 140 can utilize different techniques and layers or stacks of protocols, including, e.g., the Ethernet protocol, the internet protocol suite (TCP/IP), the ATM (Asynchronous Transfer Mode) technique, the SONET (Synchronous Optical Networking) protocol, or the SDH (Synchronous Digital Hierarchy) protocol. The TCP/IP internet protocol suite can include application layer, transport layer, internet layer (including, e.g., IPv6), or the link layer. The network 140 can be a type of a broadcast network, a telecommunications network, a data communication network, or a computer network.

One or more components, assets, or devices of utility grid 100 can communicate via network 140. The utility grid 100 can use one or more networks, such as public or private networks. The utility grid 100 can communicate or interface with a data processing system 202 designed and constructed to communicate, interface or control the utility grid 100 via network 140. Each asset, device, or component of utility grid 100 can include one or more computing devices 700 or a portion of computing device 700 or some or all functionality of computing device 700.

Figure 2:
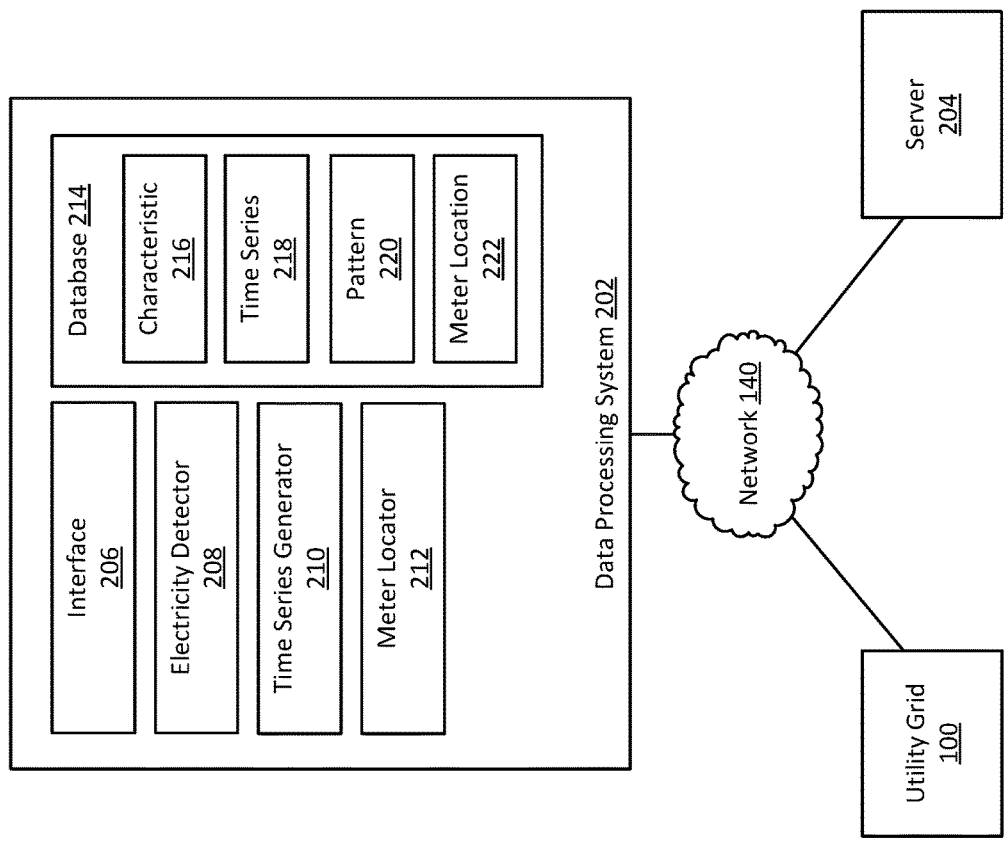
FIG. 2 is a block diagram depicting a system for locating a fault within a utility grid, in accordance with an implementation.

Referring to FIG. 2, a block diagram illustrating an example system to locate a fault within a utility grid is shown. The system 200 can include, interface with, access, or otherwise communicate with at least one utility grid 100, at least one data processing system 202, or at least one server 204. The data processing system 202 can include one or more components (e.g., one or more processors, memory, databases, interfaces, etc.) configured to perform features or functionalities discussed herein for managing the utility grid 100 or locating one or more faults or epicenter of power outages within the utility grid 100. The data processing system 202 can correspond to a metering device located in the utility grid 100. In some cases, the data processing system 202 can be a computing device remote from the utility grid 100 or the server 204. In some other cases, the data processing system 202 can be another server different from the server 204, configured to perform features and functionalities to manage the utility grid 100. The data processing system 202 can transmit or receive data to or from other components (e.g., utility grid 100 or server 204) of the system 200 via the network 140. The utility grid 100 and the network 140 can be referred to in conjunction with FIG. 1. The one or more devices, components, or systems (e.g., data processing system 202, server 204, metering devices 118, etc.) of the utility grid 100 or the system 200 can be composed of hardware, software, or a combination of hardware and software components.

The server 204 can be implemented with hardware, software, or a combination of hardware and software components. The server 204 can be a remote computing device or remote processing component from the data processing system 202 and the utility grid 100. In some cases, the server 204 can include or be a cloud storage device, such as configured to store data from the data processing system 202. For example, the server 204 can receive data from the data processing system 202, such as measured or processed data of the utility grid 100. The server 204 may store these data for retrieval by the data processing system 202. In some cases, the server 204 can include one or more processing logics or components to perform one or more tasks according to instructions received from the data processing system 202. For example, the server 204 can receive a delegated tasks or objectives from the data processing system 202. The server 204 can process data receive from the data processing system 202 and transmit the processed data back to the data processing system 202. In some cases, the server 204 can perform other features or functionalities of the data processing system 202.

The network 140 can couple devices, components, or systems for communication, such as the utility grid 100, data processing system 202, and server 204. For example, devices or systems (e.g., data processing system 202, server 204, utility grid 100, etc.) within the system 200 can communicate or interchange information via the network 140.

The data processing system 202 can include or correspond to at least one metering device 118, such as one of the metering devices 118 configured to perform one or more features (e.g., collect and process electricity characteristics) to triangulate a location of a fault in the utility grid 100. The data processing system 202 can reside on a metering device or a computing device of the utility grid 100. In some cases, the data processing system 202 can reside on a computing device or server external or remote from the utility grid 100. For instance, the data processing system 202 can reside or execute in a cloud computing environment or distributed computing environment. The data processing system 202 can reside on or execute on multiple local computing devices located throughout the utility grid 100. For example, the utility grid 100 can include multiple local computing devices each configured with one or more components or functionality of the data processing system 202.

The data processing system 202 can include one or more components to locate or determine the location of a fault on the utility grid 100 (e.g., electricity distribution grid), for instance, at least one interface 206, at least one electricity detector 208, at least one time series generator 210, at least one meter locator 212, and at least one database 214. Each of the components (e.g., interface 206, electricity detector 208, time series generator 210, meter locator 212, or database 214) of the data processing system 202 can be implemented using hardware or a combination of software and hardware. Each component of the data processing system 202 can include logical circuitry (e.g., a central processing unit or CPU) that responses to and processes instructions fetched from a memory unit (e.g., memory 715 or storage device 725). Each component of the data processing system 202 can include or use a microprocessor or a multi-core processor. A multi-core processor can include two or more processing units on a single computing component. Each component of the data processing system 202 can be based on any of these processors, or any other processor capable of operating as described herein. Each processor can utilize instruction level parallelism, thread level parallelism, different levels of cache, etc. For example, the data processing system 202 can include at least one logic device such as a computing device or server having at least one processor to communicate via the network 140.

The components and elements (e.g., interface 206, electricity detector 208, time series generator 210, meter locator 212, or database 214) of the data processing system 202 can be separate components, a single component, or part of the data processing system 202. For example, individual components or elements of the data processing system 202 can operate concurrently to perform at least one feature or function discussed herein. In another example, components of the data processing system 202 can execute individual instructions or tasks. In yet another example, the components of the data processing system 202 can be a single component to perform one or more features or functions discussed herein. The components of the data processing system 202 can be connected or communicatively coupled to one another, such as via the interface 206. The connection between the various components of the data processing system 202 can be wired or wireless, or any combination thereof. Counterpart systems or components can be hosted on other computing devices.

The interface 206 can interface with the network 140, devices within the system 200 (e.g., server 204 or utility grid 100), or components of the data processing system 202. The interface 206 can include features and functionalities similar to the communication interface of one or more metering devices 118 to interface with the aforementioned components, such as in conjunction with FIG. 1. For example, the interface 206 can include standard telephone lines LAN or WAN links (e.g., 802.11, T1, T3, Gigabit Ethernet, Infiniband), broadband connections (e.g., ISDN, Frame Relay, ATM, Gigabit Ethernet, Ethernet-over-SONET, ADSL, VDSL, BPON, GPON, fiber optical including FiOS), wireless connections, or some combination of any or all of the above. Connections can be established using a variety of communication protocols (e.g., TCP/IP, Ethernet, ARCNET, SONET, SDH, Fiber Distributed Data Interface (FDDI), IEEE 802.11a/b/g/n/ac CDMA, GSM, WiMax and direct asynchronous connections). The interface 206 can include at least a built-in network adapter, network interface card, PCMCIA network card, EXPRESSCARD network card, card bus network adapter, wireless network adapter, USB network adapter, modem, or any other device suitable for interfacing one or more devices within the system 200 to any type of network capable of communication. The interface 206 can communicate with one or more aforementioned components to receive data from at least one of the server 204 or the utility grid 100, such as data representative of electricity distribution to individual metering devices 118 within the utility grid 100.

The data processing system 202 can obtain measurements from two or more metering devices within the utility grid 100. The metering devices can include or refer to at least two of the metering devices 118. The data processing system 202 may obtain measurements from the server 204. For instance, the metering device 118 may send measurements or data to the server 204 for storage or processing. In this case, the data processing system 202 can access or obtain the measurements or processed data from the server 204 collected from one or more metering devices 118. In some cases, the data processing system 202 can correspond to at least one of the metering devices 118. For example, at least one component (e.g., electricity detector 208) of the data processing system 202 can receive electrical signals or power from the substation 104 (or the distribution point 114) to perform a measurement (e.g., one or more features of the measurement circuits of the metering device 118).

The electricity detector 208 can measure or detect an analog voltage waveform at high sampling rates (e.g., 0.5 KHz, 1 KHz, 2 KHz, 3 KHz, 6 kHz or higher) in order to accurately resolve them in digitized samples. In some cases, the electricity detector 208 can measure analog current waveform at the sampling rates (e.g., 1 kHz or higher). The electricity detector 208 can measure the analog waveform (e.g., voltage or current waveform) at a particular location on the utility grid 100 (e.g., a location of a respective metering device 118 or the data processing system 202). The analog waveform can represent the voltage, current, or power supplied by at least one of the power source 101 or the substation 104. Other data processing systems or metering devices 118 can perform similar features or functionalities discussed herein, such as triangulating a location of a fault in the utility grid 100 with respect to the various metering devices 118 experiencing an outage.

The electricity detector 208 can determine a root mean square (RMS) signal from the analog waveform, such as RMS voltage signal, RMS current signal, or RMS power signal. For purposes of providing examples, voltage waveform or RMS voltage signal can be used to detect an outage and locate a fault, however, other electrical waveforms or signals (e.g., current, power, etc.) can be measured and used to perform similar features. For example, the electricity detector 208 can determine the RMS voltage signal based on at least one of the peak, peak-to-peak, or average of the voltage waveform. The electricity detector 208 can determine the RMS signal half cycle from the measured waveform (e.g., the RMS signal may lag the waveform by half a cycle). In some cases, the electricity detector 208 can calculate the RMS signal greater than or less than half a cycle of the corresponding waveform.

Based on the measurements, the electricity detector 208 can determine a characteristic of electricity in the utility grid 100. For example, the RMS signal can correspond to or represent a characteristic of electricity measured, detected, determined, or otherwise characterized by the electricity detector 208. In some cases, the analog waveform can correspond to or represent the characteristic of electricity detected by the electricity detector 208. The characteristic of electricity can include at least one of stable (e.g., constant Vrms), fluctuations, increases, decreases, drops, or other patterns or behaviors. The characteristic of electricity can change based on electricity distributed from the substation 104 or due to interruptions at or in between one or more metering devices 118 (or data processing systems). In some cases, the characteristic of electricity can be based on whether a breaker is tripped at the substation 104.

The electricity detector 208 can detect a drop in the characteristic of electricity (e.g., RMS signal) below a threshold, such as based on a comparison between the signal (e.g., Vrms, Irms, Prms, etc.) and the threshold. The threshold may include, correspond to, or be referred to as a drop threshold, a characteristic threshold, or a minimum electricity threshold. The threshold may be configured or set by the administrator of the data processing system 202 or the manufacturer of the metering devices 118. The threshold may be in percentage or value with respect to the average, maximum, or expected amplitude (e.g., amount) of electricity supplied to the metering device 118 or entities (e.g., buildings, etc.). For example, the threshold may be set to 90%, 85%, 80%, etc. In another example, if the average or expected electricity supplied to the metering devices 118 is 120 Vrms, the threshold may be set to 108 Vrms, 102 Vrms, 96 Vrms, etc. In this case, the threshold may be with respect to the electricity supplied to individual metering devices 118. In some cases, different metering devices 118 can be supplied with different amplitudes (e.g., 170 Vrms, 150 Vrms, etc.).

The electricity detector 208 may continuously (e.g., at the sample rate) determine the RMS signal responsive to measuring, detecting, or obtaining the waveform, such as to determine the drop in electricity (e.g., characteristic in electricity). In some cases, the electricity detector 208 may calculate the RMS responsive to a drop in voltage below the threshold using the waveform. For example, the electricity detector 208 can determine that at least one of the peak, peak-to-peak, or average voltage drop below a predetermined threshold (e.g., amplitude, percentage, minimum value, etc.). The electricity detector 208 can determine the Vrms of the corresponding waveform responsive to the drop in electricity. The electricity detector 208 can determine the Vrms prior to, at, or subsequent to a time period when the voltage of the waveform drops below the threshold, for example.

The electricity detector 208 may set or trigger a power outage notification (PON) timer responsive to the electrical drop (e.g., the drop in electricity or characteristic of electricity) below the threshold. The PON timer can initiate a countdown or a timer from a time at which the electricity drops below the threshold. For example, the PON timer may be set or preconfigured to 0.2 ms, 0.1 ms, 0.05 ms, 0.025 ms, etc. The PON timer may stop or reset in response to the electricity (e.g., voltage) returning above the threshold. If the electrical signal does not return or increase above the threshold (e.g., maintain or sustain an RMS below the threshold), the electricity detector 208 can detect a timeout based on or from the PON timer. The PON timer can be preconfigured based on standards (e.g., PON standards, meter standards, etc.), by the manufacturer of the metering devices, or by the administrator of the data processing system 202.

Responsive to the timeout, the electricity detector 208 can trigger a PON sending process. For example, the electricity detector 208 can send a PON to the server 204, a computing device of the utility grid 100, a second data processing system, at least one other metering device, or other devices connected to the network 140 in response to the timeout of the PON timer. In some cases, the electricity detector 208 can receive PONs from various other metering devices, such as a subset of metering devices located in the utility grid 100 that experiences the outage. The PON can include at least an identifier (e.g., metering device ID) of the respective metering device and one or more timestamps. The timestamp can be associated with at least one of a PON start (e.g., the start of the PON timer), PON end (e.g., timeout of the PON timer), triggering of PON sending process, among others. The metering device ID can be used to obtain information associated with the respective metering device, such as the location, measured waveform, computed RMS signal, generated time series, etc. For instance, the electricity detector 208 (e.g., or time series generator 210 or meter locator 212) can access a table including a list of metering devices (e.g., metering device IDs) storing the associated metering device information, such as the location, electricity measurement data, etc. associated with a metering device ID. Hence, the electricity detector 208, or other components (e.g., time series generator 210 or meter locator 212) of the data processing system 202 can retrieve or obtain characteristics of electricity measured or computed by various metering devices located in the utility grid 100 experiencing the outage. In some cases, the table including the listing of metering devices and associated information may be stored on the server 204. In some cases, the table can be stored in the database 214, such as local to the data processing system 202 or local to individual metering devices 118. In some cases, the one or more metering devices can send information including the characteristic of electricity with or as part of the PON.

In some cases, the detected or measured waveforms can vary in characteristics before or during the outage, such as based on the type of power. For example, the electricity detector 208 can measure or detect waveforms for a single-phase, 3-phase power (e.g., phase A, phase B, and phase C), etc. The power lines connecting the metering devices within a zone (e.g., area or locations of metering devices) or under the same substation 104 may supply a similar type of power (e.g., single-phase or 3-phase power). In some cases, certain metering devices may receive a type of power different from other metering devices. For instance, a first metering device may measure a waveform for single-phase power, while a second metering device may measure another waveform for 3-phase power. For single-phase power, the electricity detector 208 may measure a single waveform over time. For three-phase power, the electricity detector 208 may measure or detect three waveforms associated with the three phases. The electricity detector 208, time series generator 210, or the meter locator 212 may analyze one or multiple phases as discussed herein.

For example, based on a pre-configuration by the administrator or operator of the metering device, utility grid 100, or the data processing system 202, the electricity detector 208 may determine the RMS signal for one of the phases or multiple phases measured by the metering devices for generating the time series. The electricity detector 208 can determine which of the phases to analyze based on which of the phases faulted, for instance, the phrase that caused the drop in electricity thereby triggering the PON sending process. In some cases, the electricity detector 208 may determine to analyze multiple faulted phases. Accordingly, the electricity detector 208 can determine the RMS signal for one or more phases of the measured waveform to provide the time series generator 210 for generating at least one time series.

The time series generator 210 can generate a time series of a rate of change of the characteristic of electricity for a predetermined number of cycles subsequent to the detection of the drop. The time series generator 210 can generate the time series in response to detecting the drop in the characteristic of electricity (e.g., the RMS signal lower than the threshold) for one or more metering devices. In some cases, the time series generator 210 may generate the time series in response to receiving PONs from metering devices within the utility grid 100. Receiving the PONs may correspond to or include accumulating or obtaining at least RMS signals of a subset of metering devices sending the PONs, timestamps (e.g., PON start, PON end, etc.), metering device IDs, location of metering devices sending the PONs, etc. For example, the time series generator 210 can monitor a count of the number of active metering devices and the number of PONs received responsive to an outage. The time series generator 210 may proceed to generate the time series in response to obtaining a predetermined portion of PONs (e.g., including RMS signals and timestamps of at least the PON start) from metering devices experiencing the outage, such as 50%, 70%, 85%, 90%, 95%, etc. of the total number of meters.

In some cases, the time series generator 210 may initiate the time series generation process in response to receiving at least a predetermined number of PONs, such as 10, 20, 50, etc., where individual PONs may be associated with respective meters. In some cases, at least one metering device may send multiple PONs, such as when the electricity fluctuates above and below the threshold subsequent to trigging the PON send process. In another example, the time series generator 210 may receive a notification or be triggered by the electricity detector 208 subsequent to triggering the PON (e.g., PON sending process) to generate the time series.

In some cases, the time series generator 210 may initiate the time series generation process at a predetermined time subsequent to receiving or detecting a PON (e.g., a first PON). For example, the predetermined time may be any length of time to provide various metering devices (e.g., 80%, 90%, etc. of the total number of metering devices) experiencing the outage to send the PON, such as 0.1 seconds, 0.05 seconds, etc. Accordingly, the time series generator 210 may standby for the predetermined time after receiving the first PON (e.g., and the characteristic of electricity for one or more metering devices does not rise above the threshold) to collect data for generating the time series.

To generate a time series, the time series generator 210 can determine a derivative (e.g., dV/dt, &Mt, etc.) in time of the RMS signal (e.g., RMS voltage signal, RMS current signal, etc.). The derivative of the signal can represent the rate of change in the RMS signal at a particular point in time. For instance, higher dV/dt corresponds to a greater rate of change and lower dV/dt corresponds to a lower rate of change of electricity (e.g., rate of the drop in electricity for a particular metering device). The time series generator 210 can compute or determine the derivative of the RMS signal at a period of time (e.g., a point in time of the signal) during the electrical drop. The time at which to determine the derivative can be preconfigured by the administrator of the metering devices or the data processing system 202 based on an event (e.g., PON start, among others), such as at, before, or after the PON start. The PON start time can vary between metering devices, with different rates of change. For purposes of example, the time series generator 210 can determine the derivative herein for one or more metering devices at the PON start timestamp associated with respective meters. In some other cases, the time series generator 210 can determine the derivative at another point in time (e.g., before or after the PON start) during the electricity drop.

The time series generator 210 can generate the derivative for various metering devices that sent the PONs. In some cases, individual metering devices can include one or more features or functionalities of the data processing system 202, such that the time series generator 210 can receive at least one of the computed derivative or generated time series from other metering devices (e.g., to update an existing time series).

The time series generator 210 can generate a time series of values based on derivatives of RMS signals from metering devices 118 that detect the drop in electricity or send the PONs. The time series can be used to generate a plot of metering devices and the dV/dt (or dI/dt, etc.) associated with the respective meters. The time series generator 210 can include the metering devices and the dV/dt values on one of the axes of the plot, such as metering devices on the x-axis and dV/dt on the y-axis, or vice versa. The time series generator 210 can arrange the metering devices based on the location (e.g., obtained from the server 204 or the database 214). For example, the time series generator 210 can arrange the listing of metering devices in the time series from closest to furthest from the power source 101, substation 104, as discussed in examples herein. In some cases, the time series generator 210 may arrange the metering devices from the furthest to closest to the substation 104. Accordingly, based on the location of the metering devices and the determined derivatives, the time series generator 210 can generate the time series for comparing metrics (e.g., dV/dt) computed between metering devices that sent the PON to determine or estimate a distance to the fault.

In some cases, the time series generator 210 may generate the time series for one or more phases, such as for 3-phase power. For example, the time series generator 210 can identify at least one faulted phase that triggered PON. The time series generator 210 may compute the derivative (e.g., metric) of the RMS signal associated with the at least one faulted phase for various meters. Accordingly, the time series generator 210 can generate the time series based on the derivative of the at least one phase measured by the meters. In some cases, the time series generator 210 may generate multiple time series for various phases measured by the individual meters.

The time series generator 210 can normalize the time series, for example, to 100, among other values. The normalization of the time series can represent a likelihood percentage for the fault location to correspond to or be near the location of the respective meter. For example, a first metering device, a second metering device, and a third metering device can be located in the electricity distribution grid. The time series generator 210 can determine and plot the dV/dt of the three metering devices in the time series. For example, a first dV/dt of the first metering device may be 10 Vrms/µs, a second dV/dt of the second metering device may be 5 Vrms/µs, and the third dV/dt of the third metering device may be 2 Vrms/µs. When normalizing to 100, for example, the time series generator 210 can determine a multiplier (e.g., normalization factor or scaling value) for all derivatives by dividing 100 with the highest computed derivative (e.g., 10 in this case). In this example, the time series generator 210 can determine that the multiplier is 100/10=10 for normalizing the derivatives. Accordingly, the dV/dt of the first metering device is normalized to 100, the second metering device is normalized to 50, and the third metering device is normalized to 20. The time series generator 210 can perform other features, functionalities, or techniques to normalize the time series (e.g., values of the time series). In some cases, the time series generator 210 can use the normalized derivatives to generate the time series.

The meter locator 212 can determine the location of one or more metering devices relative to the fault on the utility grid 100 based on the time series. The meter locator 212 can use the generated time series to compare the metrics (e.g., dV/dt) between the metering devices to determine the locations of the metering devices relative to the fault. The comparison between the metering devices can refer to or include comparing the magnitude of the computed derivatives between the metering devices, such as to determine one or more metering devices with the highest rate of change (e.g., dV/dt) of the characteristic of electricity at the PON start time period or between the PON start and PON end timeframe.

In some cases, the comparison can include or correspond to comparing the time series to one or more predetermined patterns. For example, the meter locator 212 may compare the time series to at least one predetermined pattern stored in the database 214 or obtained from an external device (e.g., the server 204 or a computing device of the utility grid 100). The meter locator 212 can compare or match the time series to one or more patterns to identify a relative location of the fault. The patterns can represent or include historical derivative data of various metering devices measured, computed, or recorded during an outage or fault. The one or more patterns can be associated with at least one of a phase A fault, phase B fault, phase C fault, a combination of multiple faulted phases, single line-to-ground (SLG) fault, double SLG fault, line-to-line-to-ground fault, bolted line-to-line fault, three-phase bolted fault, among others. The one or more patterns can be associated with whether a circuit breaker located at the substation 104 is tripped. For instance, the meter locator 212 can compare the series to a specific pattern based on the type of fault indicated in the PON (e.g., the metering device detecting the type of fault) or whether the breaker was tripped at the substation 104. The meter locator 212 can obtain information on the type of fault and the breaker trip from at least one of the individual metering devices sending PONs, the computing device of the utility grid 100 or associated with the substation 104 (e.g., monitoring electricity or equipment events), the server 204, among other devices.

In some cases, the meter locator 212 may compare the time series to one or more patterns to identify at least one pattern with the highest similarities. For example, the meter locator 212 can identify at least one pattern with at least one of a similar rate of inclination, declination, sustention, among other characteristics to the time series. The pattern may include a relatively inclined portion and a relatively declined portion, or other subsets of patterns. Upon identifying the comparable pattern to the time series, the meter locator 212 may identify or determine the relative location of the fault in the time series (e.g., relative to the location of the data processing system 202 or at least one metering device 118) based on an indication of a historical fault identified in the pattern.

Figure 3:
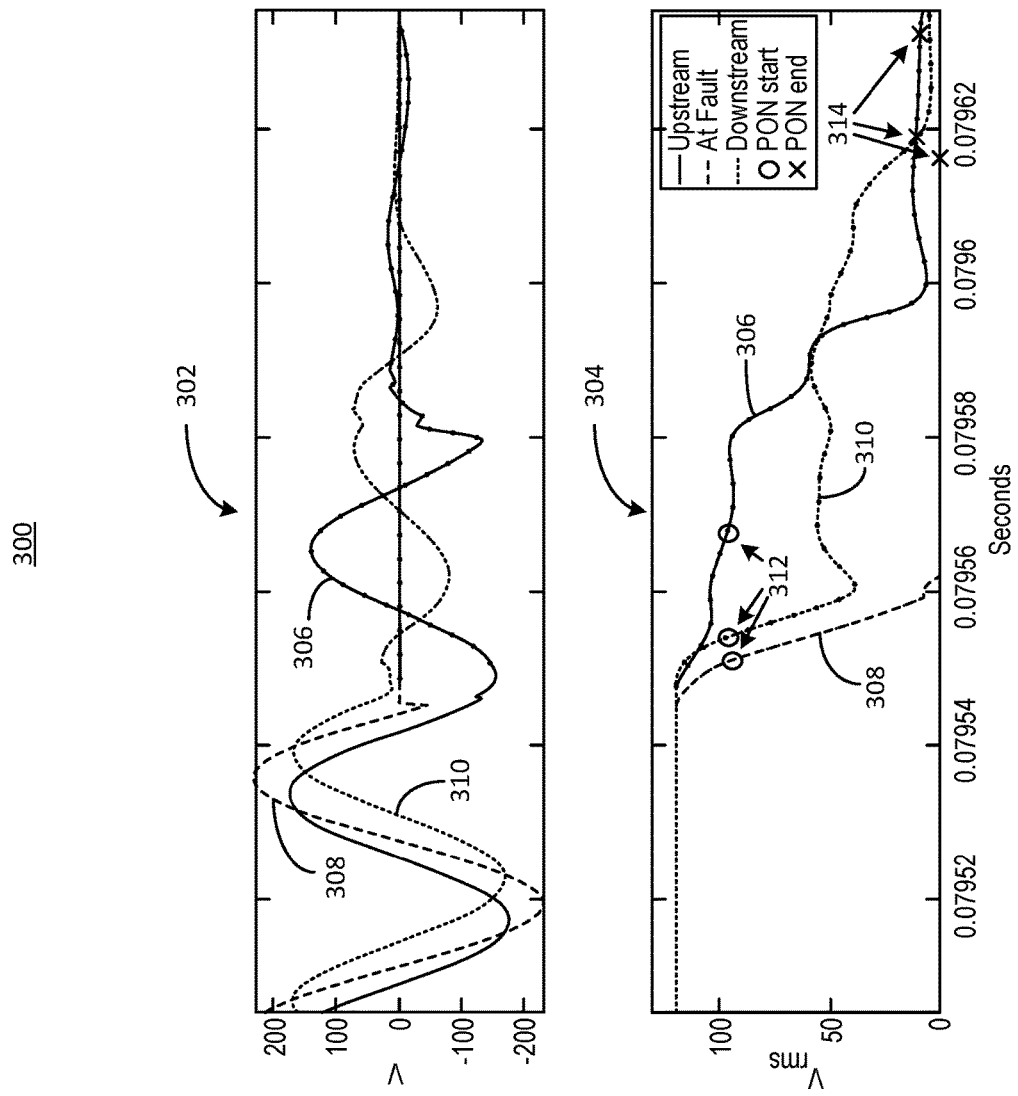
FIG. 3 are graphs of example simulated fault characteristics in waveforms and root mean square (RMS) signals, in accordance with an implementation.

For example, the pattern may indicate a location of the fault based on the characteristics of the drop in electricity (e.g., patterns of the voltage waveform drop, such as shown in FIG. 3). The pattern can be based on historical measurement data from various metering devices within the grid 100 during past outages. The pattern can be managed, edited, or configured by the administrator of the data processing system 202, for example. In some cases, the pattern can indicate a fault location at a peak (e.g., highest point or max value) of the normalized time series. The peak may be a point of transitioning between an inclination (e.g., the incline slope) and declination (e.g., the decline slope). The pattern may be based on historical data, such as one or more past generated or normalized time series during outages. The pattern may be generated historically by the data processing system 202, one or more metering devices within the utility grid 100, other data processing systems, the server 204 (e.g., cloud computing device), among other devices. One or more examples of the fault location can be shown in at least FIGS. 4-5C. In some cases, the pattern may be generated based on physics-inferred characteristics of electricity (e.g., voltage or current) during outages. For example, characteristics of electricity during an outage for each metering device, such as the rate of change in electricity, may be different based on at least one of the distance from the fault location or whether the metering device is upstream or downstream from the fault location. According to the physics of electricity, the server 204 (or other devices within the network 140) can determine the expected characteristics of electricity (e.g., rate of change or measurement fluctuation) associated with various locations upstream or downstream from a fault location. Hence, the pattern can be generated based on the expected physics-inferred electrical characteristics, e.g., for the meter locator 212 to compare measurements from the metering devices to the pattern.

The meter locator 212 can determine that the time series exhibits similar behaviors as one or more patterns representing a metering device located upstream of a fault location. The meter locator 212 can determine that the time series exhibits similar behaviors as one or more patterns representing a metering device located downstream of the fault location. If the time series matches or is similar to at least one pattern, the meter locator 212 can use the fault location from the similar (e.g., comparable) pattern for mapping to the fault location associated with the metering devices in the time series (e.g., normalized time series). For example, the pattern can indicate that the fault location is at the peak (e.g., highest derivative(s) or normalized value(s)), near the peak (e.g., before or after the peak), at least one of the peaks if the pattern and the time series include multiple peaks, among other portions of the time series. In some cases, the meter locator 212 can compare multiple phases to multiple patterns to determine a set of patterns that matches or is similar to the time series. For example, the meter locator 212 can identify a set of patterns (e.g., three patterns associated with phases A-C) having similar behavior during the outage as the time series. The meter locator 212 can compare a first pattern, a second pattern, and a third pattern in the set of patterns to the computed derivatives associated with phases A-C, respectively. The patterns or behaviors of the individual phases may be shown in at least FIG. 5B, for example. The pattern can include fluctuations, steepness of inclinations or declinations, number of peaks, sections of incline or decline, among other types of patterns to be compared to the time series or normalized time series.

If the time series is not similar to at least one pattern, the meter locator 212 may be preconfigured to send the time series to the administrator of the data processing system 202 or the computing device of the utility grid 100, for example. In some cases, if the time series does not match at least one pattern, the meter locator 212 may select or identify the location(s) associated with one or more metering devices with the highest change in voltage at or around the PON start time period as the metering devices nearest to the fault location. For instance, the meter locator 212 can identify one or more metering devices in the normalized time series representing the highest likelihood of the fault location. Accordingly, the meter locator 212 can identify one or more metering device locations (e.g., fitting the pattern or associated with the highest likelihood of being near or at the fault location) to estimate or determine the approximate or relative location of the fault with respect to the one or more metering devices.

Responsive to identifying one or more metering devices nearest or at the fault location, the meter locator 212 can provide the location(s) of the metering device(s) for display or as an alert. For example, the meter locator 212 can identify and provide the location of at least one metering device to a display device or an external device (e.g., the computing device of the utility grid 100) operated by an administrator or operator. The administrator may access, view, or otherwise obtain one or more metering device locations associated with at least one fault location to restore power to the metering devices 118 or entities (e.g., buildings, etc.), such as by repairing or performing maintenance to the power line, etc. Accordingly, by providing the fault location in response to the drop in the characteristic of electricity, the data processing system 202 (e.g., components thereof) can improve the Customer Average Interruption Duration Index (CAIDI) score or increase customer satisfaction utilizing the electricity from the utility grid 100.

The data processing system 202 can include the database 214 to store information or data collected, measured, obtained, or otherwise received as discussed herein. The database 214 may be referred to as a data storage, data repository, memory device, etc. The database 214 can include at least a characteristic storage 216, time series storage 218, pattern storage 220, and metering device location storage 222. The database 214 can include other types of storage to store information for locating the fault within the electricity distribution grid. In some cases, information stored in the database 214 can be uploaded to the server 204, among other cloud storage devices, and downloaded to the database 214 for processing. In some other cases, the information stored in the database 214 may be local to the data processing system 202. The database 214 can be accessed by one or more components (e.g., electricity detector 208, time series generator 210, or meter locator 212) of the data processing system 202, or at least one external device, such as other metering devices within the utility grid 100, the server 204, etc.

The characteristic storage 216 can include, store, or maintain the characteristic of electricity measured by the electricity detector 208 or the meter. The characteristic storage 216 can store the characteristic of electricity of other meters. The characteristic storage 216 can include timestamps associated with the measured electricity. For example, the characteristic storage 216 can continuously store measurements from the electricity detector 208 or one or more metering devices within the grid. The characteristic storage 216 can include timestamps in ms, μs, etc. associated with the measurements. The characteristic of electricity can include or correspond to at least one of the measured waveform or computed RMS signal.

The time series storage 218 can include, store, or maintain time series associated with various meters. The time series may be generated by the time series generator 210. For example, responsive to generating the time series, the time series storage 218 can receive the time series from the time series generator 210 for storage. The time series storage 218 may store the derivatives (e.g., dV/dt, dI/dt, etc.) of the RMS signals associated with respective meters. For example, the time series generator 210 may compute the derivatives of the RMS signals and store the computation results in the time series storage 218. The time series generator 210 may use the derivatives to generate the time series. The time series storage 218 can store the normalized time series, such as normalizing the derivatives to 100, among other values. The time series storage 218 may store a time series or plot of the likelihood of fault location, which may correspond to the normalized time series.

The pattern storage 220 can include, store, or maintain historical patterns of the characteristic of electricity (e.g., or time series or normalized time series) during an outage. The patterns can be associated with a single phase power, 3-phase power, individual phases of the 3-phase power, etc. The patterns can be historical patterns measured, analyzed, or constructed during an outage of at least one of the phases. The pattern storage 220 can store a fault location associated with the respective pattern. For example, the pattern storage 220 may store or indicate a fault location to be at a peak, before the peak, or after the peak of the time series. The pattern storage 220 may include the rate of inclination, rate of declination, the number of peaks, fluctuation rate, among other types of patterns. The pattern may be associated with whether the breaker at the substation 104 has been tripped due to the outage. The pattern storage 220 may be accessed by the meter locator 212, such as to compare the pattern to the time series (or normalized time series). For instance, by comparing the pattern to the time series, the meter locator 212 can identify the fault location relative to the metering device locations based on a mapping to the fault location indicated in the pattern. The one or more patterns may be updated, such as by the administrator of the utility grid 100 or the component(s) of the data processing system 202 responsive to an actual location of the fault (e.g., determined by electricians repairing the power lines, etc.) relative to one or more metering devices. In some cases, the one or more patterns may be generated by a machine learning engine trained using historical time series and the reported fault location relative to the metering devices, for example.

The metering device location storage 222 can include, store, or maintain the locations of the meters. The metering device location storage 222 can store the metering device locations provided by the computing device of the utility grid 100 (e.g., or the administrator-provided location) or the server 204. The metering device location storage 222 may update the location of one or more metering devices based on metering device's availability or changes in the location reported by the computing device of the utility grid 100 or the server 204. The metering device location storage 222 can include metering device IDs associated with the metering device locations. In some cases, responsive to determining the fault location, the metering device location storage 222 may store or include the location of the fault relative to individual metering device locations. For instance, the operator or electrician may retrieve at least one metering device location and determine a distance, direction, or location from the fault. The metering device location storage 222 may update the metering device location upon receiving an identification of a new metering device added to the electricity distribution grid, removal of existing metering device(s), etc.

Referring now to FIG. 3, depicted are graphs of example simulated fault characteristics 300 in waveforms and RMS signals. The simulated fault characteristics 300 can include a waveform graph 302 and RMS signal graph 304. The one or more features or functionalities discussed herein to generate or compute the graphs 302 and 304 (e.g., subplots) can be performed by one or more devices, components, or systems (e.g., the data processing system 202, server 204, network 140, metering devices 118, or computing device of the utility grid 100) of at least the system 200 in conjunction with FIG. 2. For example, the data processing system 202 can measure the characteristic of electricity (e.g., voltage, current, power, etc.) associated with one or more metering devices located in the electricity distribution grid to generate or construct the waveform graph 302. In some cases, the data processing system 202 can obtain data from various metering devices to generate or present the waveform graph 302. In another example, using the measured waveform, the data processing system 202 can compute or determine corresponding RMS values or signals. The data processing system 202 can generate and present the RMS signals as in RMS signal graph 304, for example.

In further example, by utilizing the digitized waveforms (e.g., of graph 302) at high sampling rates or resolutions, the data processing system 202 can perform computation on metering points that are experiencing power outages to determine the characteristics of the power outages (e.g., drop in the characteristic of electricity). For example, the data processing system 202 can compute the characteristics (e.g., fluctuations, increases, decreases, among other patterns) in the behavior of the voltage during the outage. In other examples, the data processing system 202 may compute the characteristic in the behavior of the current or power during the outage. Based on the characteristics, the data processing system 202 can determine a relative distance to the fault compared to other metering devices also subject to the outage (e.g., the same outage as the metering device). The relative distance can refer to the distance of one or more metering devices experiencing the power outages relative to the location of the fault.

Still referring to FIG. 3, the data processing system 202 can compute and identify the characteristics of the fault, such as based on simulated fault characteristics in voltages and current waveforms. For example, the voltage waveforms and corresponding root mean square ("RMS") signals as a function of time that can be measured by the metering devices of the utility grid 100. The data processing system 202 can include, be a part of, or correspond to the metering devices measuring the waveform or RMS signals, for example. The voltage waveform can be shown in graph 302.

The data processing system 202 can measure the voltage waveforms in graph 302 from various metering devices, such as metering devices placed or located upstream, at, or downstream of a fault. In this case, the fault can be a simulated single line-to-ground ("SLG") fault. For example, the waveform or signal 306 can correspond to at least one metering device upstream of the fault. The waveform or signal 308 can correspond to at least one metering device at the fault. The waveform or signal 310 can correspond to at least one metering device downstream of the fault. A downstream metering device can refer to the metering device further from the substation 104. The upstream metering device may refer to a metering device closer to the substation 104.

The data processing system 202 (or the server 204) can calculate RMS signals of graph 304 corresponding to the waveforms of graph 302. The RMS signal may lag the waveform by one-half cycle, such as due to the RMS value being calculated every half cycle. In some cases, the data processing system 202 may calculate the RMS signal at other cycles, such as more or less than one-half cycle. The subplot or graph 304 representing the RMS signals as a function of time can include an indication of a point in time at which the RMS voltage drops below a threshold of its nominal value (e.g., 80%, 0.8 per unit ("pu"), 120 Vrms, among other predetermined threshold set by the administrator or operator of the data processing system 202 or the utility grid 100). This point in time where the RMS voltage drops below the threshold can be referred to as a Power Outage Notification ("PON") start, presented as point(s) 312. The points 312 or PON start can be at the same Vrms value. In some cases, the PON start may be at different time periods. Further, the subplot can include an indication of a predetermined amount of time (e.g., configurable by the administrator or operator of the data processing system 202) after the voltage is sustained below 0.8 pu where the PON is triggered and sent to the data processing system 202. The point after the predetermined amount of time can be referred to or labeled as PON end, presented as point(s) 314. The subplots or graphs 302 and 304 of FIG. 3 are examples of the simulated fault characteristics. As such, the voltage waveform characteristics may differ depending on the location of the metering device to the fault.

Figure 4:
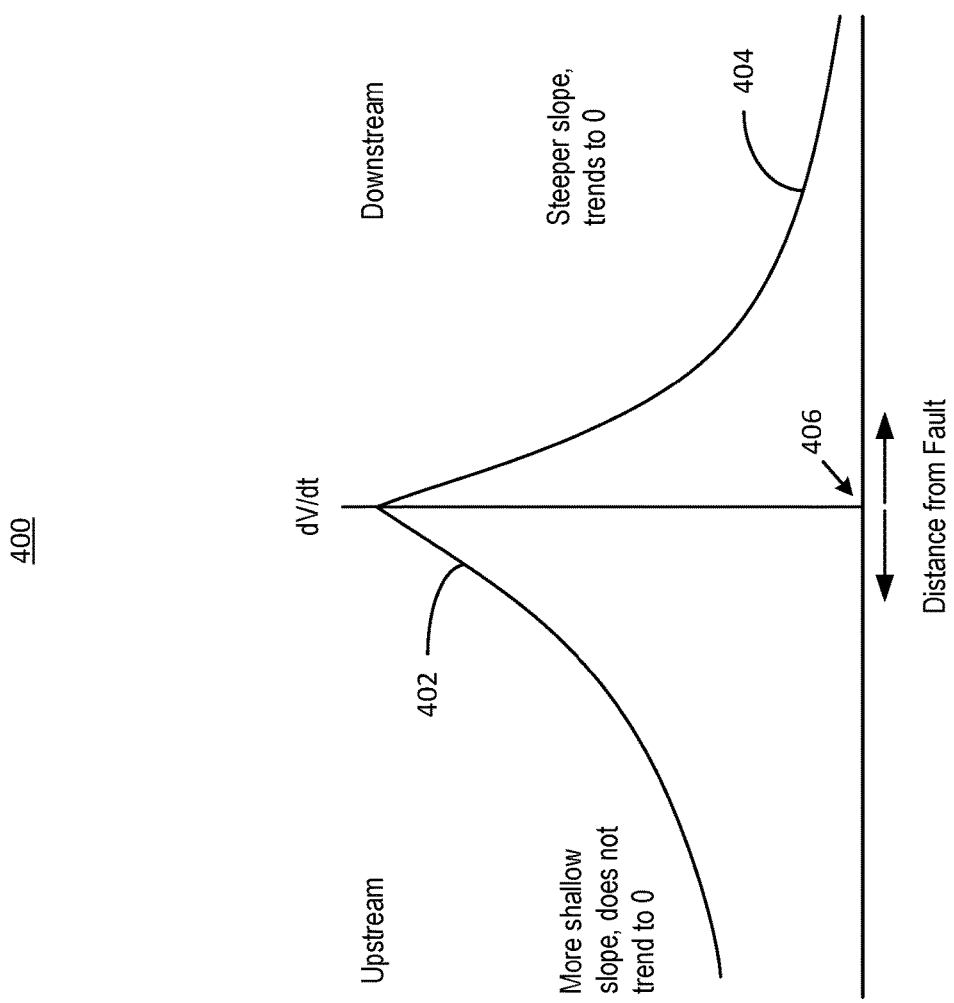
FIG. 4 is a graph of example root mean square ("RMS") voltage time derivative behavior in the presence of a three-phase fault, in accordance with an implementation.

Referring to FIG. 4, depicted is a graph 400 of example RMS voltage time derivative (e.g., RMS voltage signal) behavior in the presence of a three-phase fault. In further example from the above, using RMS voltage signal between 0.8 pu and the PON, the data processing system 202 can determine or compute various statistical parameters (e.g., min, max, standard deviation, mean, etc.) from the first derivative in time of the RMS voltage signal (e.g., denoted as dV/dt) over data windows ranging from one sample in length to the entire data clip, such as from the PON start to PON end. Graph 400 can include an example of the general behavior of the first derivative (e.g., RMS signal), such as for a 3-phase fault that does not trip an upstream circuit breaker. The RMS signal for a single-phase fault, or other faults that may or may not trip the upstream circuit breaker may provide similar or varying signal behavior. The data processing system 202 can apply or perform the one or more operations or features discussed herein for any type of fault with either the breaker being tripped or not tripped to determine the fault location, at least relative to one or more metering devices.

For example, the data processing system 202 can compute the relative distance of a metering device to the fault by comparing the calculated metrics (e.g., the first derivative in time of the RMS voltage signal) to other metering devices within the utility grid 100 experiencing the outage or metering devices that have sent PONs, such as to the data processing system 202 (or headend system). The computed relative distance can be shown in graph 400. Graph 400 can include an example pattern or derivative behavior of various metering devices upstream or downstream of the fault location 406. Line 402 can represent metering devices upstream from the fault location 406 and line 404 can represent metering devices downstream from the fault location 406. Upstream metering devices may be closer to the substation 104 and downstream metering devices can be further from the substation 104. For example, based on the derivatives computed at or around PON start time for the metering devices, the data processing system 202 may identify that the derivatives of upstream metering devices provide a shallow slope that does not trend to zero. The data processing system 202 may identify that the derivatives of the downstream metering devices provide a steeper slope trending to zero, such as based on a comparison of line 404 to line 402. An example plot of the comparison between the metric and other metering devices using a simulation of an SLG fault on phase B of a 3-phase, unbalanced circuit can be shown in at least FIG. 5A. Other patterns in addition to the pattern of graph 400 can be shown in at least FIGS. 5A-C.

Figure 5A:
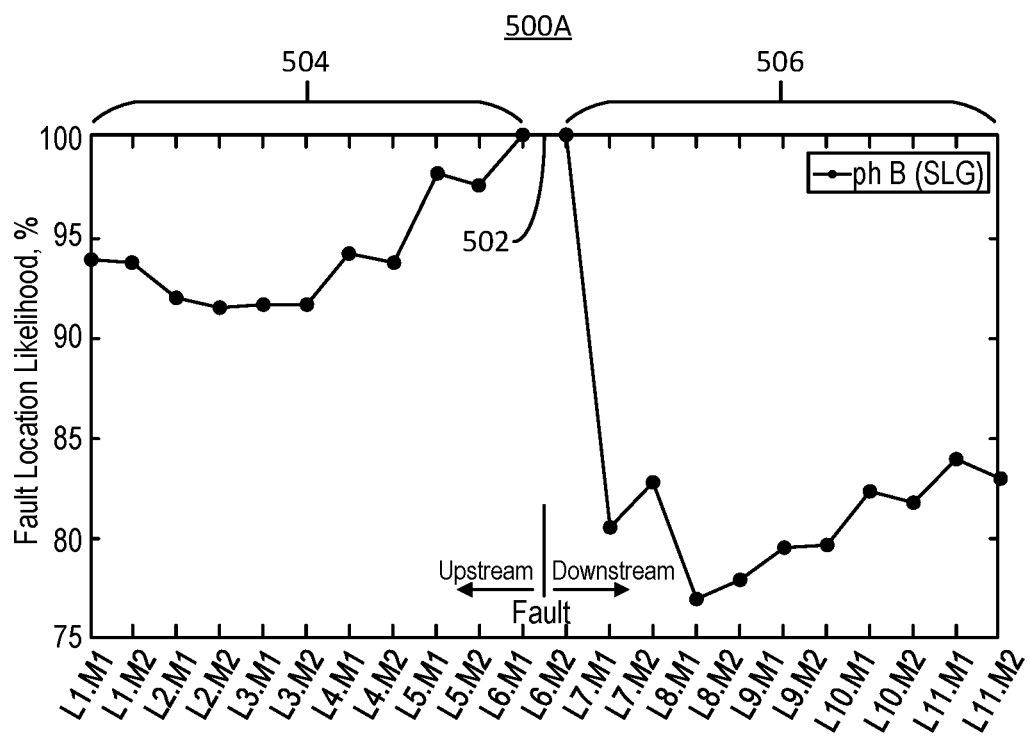
FIG. 5A is a graph of an example accurate single line-to-ground ("SLG") fault localization on the phase the fault occurred on, in accordance with an implementation.

Referring to FIG. 5A, depicted is a graph 500A of an example accurate single line-to-ground ("SLG") fault localization on the phase the fault occurred on. Each element (sometimes referred to as a tick, increment, or position) along the x-axis can represent a metering device on phase B that reported a PON to the data processing system 202 during an outage. The graph 500A (e.g., or other graphs 500B-C) can represent a normalized time series representing fault location likelihood. The computed normalized derivative in graph 500A can represent the phase B of a three-phase power line reporting the PON. In this case, at least for illustration purposes, the arrangement of the metering devices can be presented from left-to-right as closest-to-farthest, respectively, from the substation 104. In some cases, the denoted L and M along the x-axis may represent the metering device and sample, respectively. In some other cases, the denoted L and M may represent a location, area, or general position and the metering device at the location, respectively. For example, at L1, M1 (e.g., metering device one or first metering device at L1) can be closer to the substation 104 than M2 (e.g., metering device two or second metering device at L1). In another example, L1 to L11 of graphs 500A-C can represent locations closest to farthest from the substation 104.

In this example, the fault may occur between metering devices L6.M1 and L6.M2, such as indicated by the vertical line within the graphs 500A-C (e.g., fault location 502). A circuit breaker located at the substation 104 may be tripped (e.g., removing power from all three phases) at a realistic time delay after the fault. The metering devices L1.M1 to L6.M1 may be upstream from the fault location 502 (e.g., upstream metering devices 504). The metering devices L6.M2 to L11.M2 may be downstream from the fault location 502 (e.g., downstream metering devices 506). Similar to the pattern of graph 400, the derivatives of the upstream metering devices 504 (e.g., located near the substation 104 to the fault location 502) can exhibit a shallow incline behavior not trending to zero. Further, the derivatives of the downstream metering devices 506 (e.g., from fault location 502 onward) can exhibit a steeper decline (e.g., compared to the upstream metering devices 504) behavior trending to zero.

For each metering device within the utility grid 100, the data processing system 202 can calculate their respective metrics from the first derivative in time of the RMS voltage signal recorded during the fault (e.g., from 0.8 pu to the PON trigger, referring to the previous example). The data processing system 202 can normalize the calculated metrics to 100, as plotted in FIGS. 5A-C, for example. Accordingly, using the above techniques or algorithms, the data processing system 202 can locate a metering device or the two closest metering devices to the fault (e.g., L6.M1 and L6.M2). The asymmetric behavior, as shown in example FIG. 5A, between the upstream metering devices 504 and downstream metering devices 506, may be due to the latent voltage on phases A and C which may drop slower if the metering device is farther downstream from the substation 104 after the 3-phase circuit breaker is tripped. In some cases, the data processing system 202 can compare the pattern shown in at least one of graph 400, graph 500A, etc. to a generated time series, such as to determine the location of the fault relative to one or more metering devices. In this example, the graph 500A can show the locations of metering devices L1.M1 to L11.M2 relative to the fault location 502.

Figure 5B:
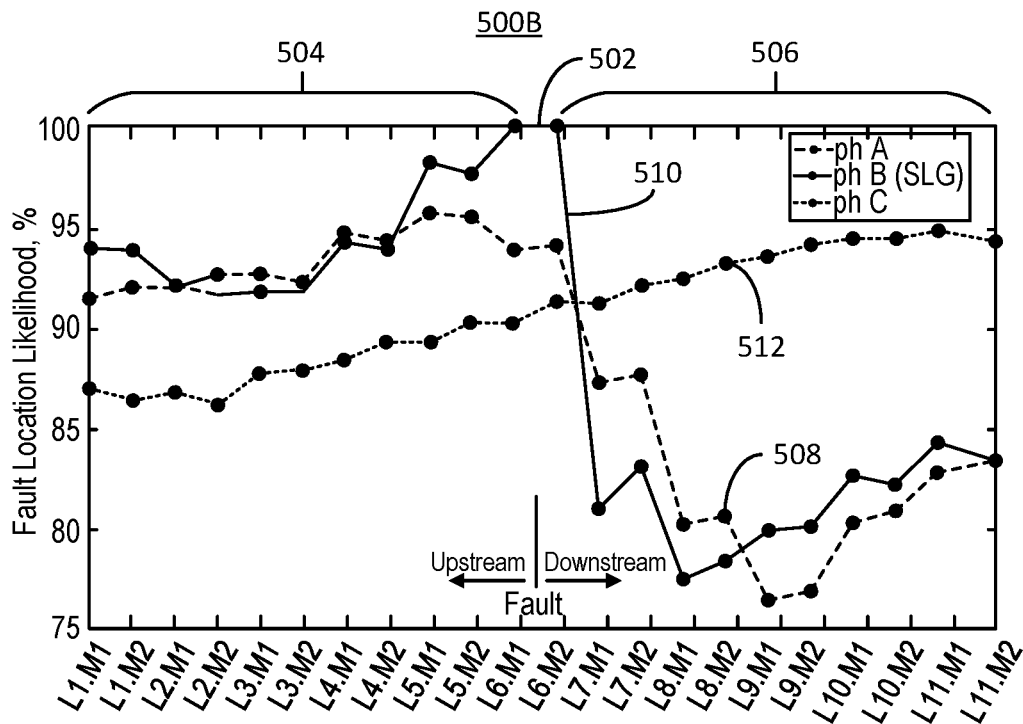
FIG. 5B is a graph of an example accurate SLG fault localization among all three phases, in accordance with an implementation.

Referring to FIG. 5B, an example graph 500B of an accurate SLG fault location among all three phases is shown. The fault depicted in graph 500B can be similar to the fault of graph 500A. In this example, the data processing system 202 can generate and normalize a time series for all phases (e.g., phase A, phase B, and phase C) of the three-power. Referring to the previous example of graph 500A, phase B may be shown without the non-faulted phases (e.g., phase A and phase C). For example, graph 500B can include the phase B line 510 similar to the time series behavior of graph 500A. The computed time series for phase A and phase C can correspond to lines 508 and 512, respectively. As shown in this example, the magnitude at the fault location 502 of the determined metrics (e.g., phase B) is higher on the faulted phase as compared to the non-faulted phases, such as phase A or phase C (e.g., indicating approximately 90% to 95% likelihood of fault location).

The non-faulted phases (e.g., phase A and phase C in this case) can exhibit different behaviors or patterns. For example, lines 508 and 512 of graph 500B can indicate the behavior of phase A and phase C power, respectively, during an outage (e.g., at or around PON start time). In the example of graph 500B, the pattern of phase A (e.g., line 508) can include or indicate a slight incline slope from L1.M1 to L5.M2, and a steep decline slope from L6.M2 to L9.M1. In another example of graph 500B, the pattern of phase B (e.g., line 512) can indicate a gradual inclination (e.g., small increases) from the upstream metering devices 504 to the downstream metering devices 506. Other patterns may be exhibited by the non-faulted phases.

The data processing system 202 may compare the normalized time series of at least one faulted phase to a predetermined pattern. In this example, the data processing system 202 can compare phase B to the pattern, such as patterns shown in at least one of graphs 400, 500A, and 500B. In some cases, the data processing system 202 may compare one or more other phases (e.g., faulted or non-faulted phases) to at least one additional pattern. For instance, in an SLG fault, the data processing system 202 can compare the three phases to three patterns associated with the individual phases, such as shown in graph 500B. The predetermined patterns may indicate a historical location of a fault. In some cases, the data processing system 202 can determine or identify the fault location based on similarities between one or more phases of the time series compared to one or more respective patterns.

Figure 5C:
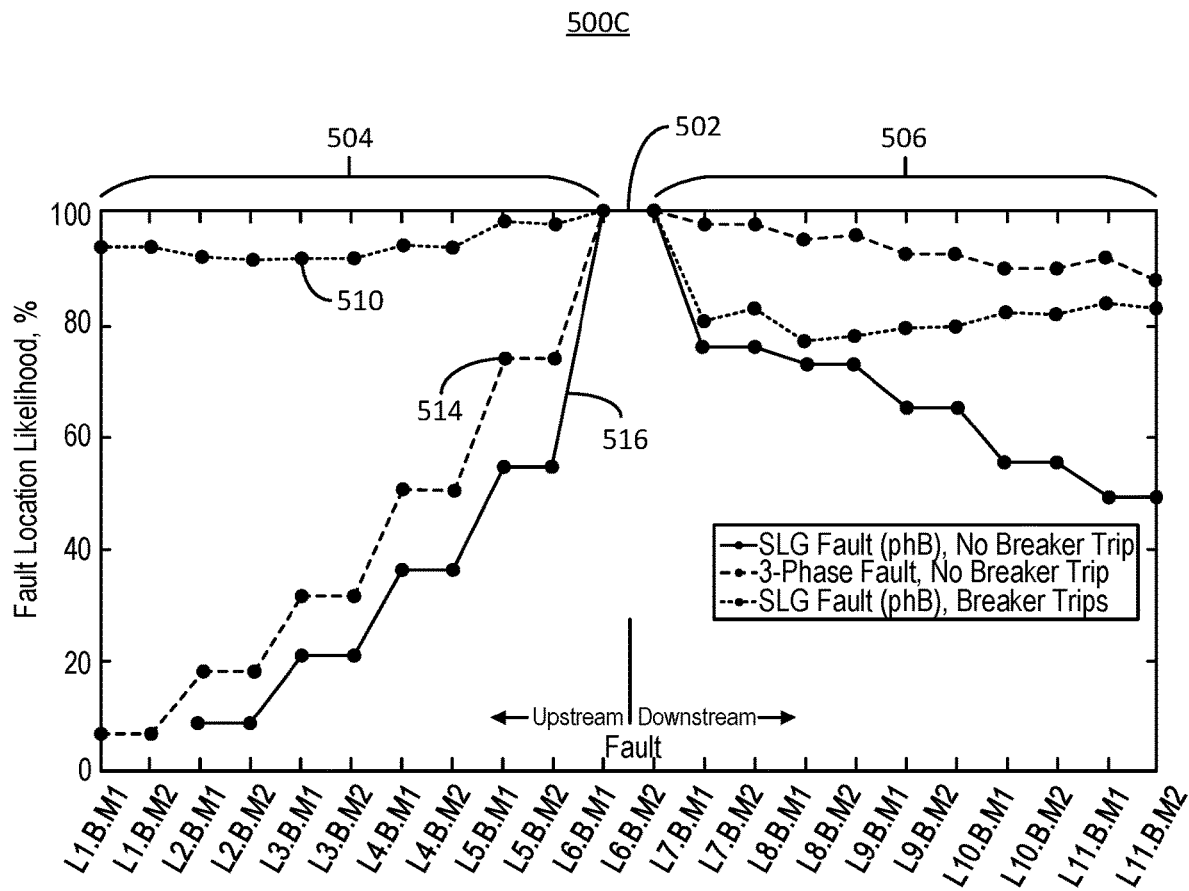
FIG. 5C is a graph of example successful fault localization results for SLG and three-phase faults with and without an upstream circuit breaker tripping, in accordance with an implementation.

Referring now to FIG. 5C, an example graph 500C illustrating that the computed metrics can be used by the data processing system 202 to successfully distinguish fault behavior as a function of the type of fault and upstream circuit breaker operation. In particular, the data processing system 202 can use the computed metrics compared to other metering devices to distinguish fault behaviors as discussed herein. The data processing system 202 can calculate the three lines (e.g., lines 510, 514, and 516) on the phase B signals at each metering device. The SLG fault line with breaker trips of FIG. 5C (e.g., represented as line 510) may correspond to phase B line as in FIGS. 5A-B.

The SLG fault line without breaker trips of FIG. 5C (e.g., represented as line 516) can be in the same condition (e.g., similar fault location 502 or similar type of fault) as the SLG fault line with breaker trips, except that the upstream circuit breaker does not trip. In this case, the pattern of an SLG fault phase B without breaker trip may include or indicate a steeper incline which does not trend to 0 upstream of the fault location and a shallower decline that trend to 0 downstream of the fault location, for example. In the case of phase B without a breaker trip, the voltage may be maintained on one or more (or all three) phases upstream of the fault location 502 (e.g., maintained for the upstream metering devices 504). Accordingly, the metering devices downstream (e.g., downstream metering devices 506) of the fault location 502 can be seen to have a higher score (e.g., a high percentage of likelihood or rate of change) as they have lost power, while those upstream are still connected to the substation 104 and supplied with electricity since the breaker did not trip in the case of line 516.

Further, the 3-phase fault line with no breaker trip in FIG. 5C (e.g., represented as line 514) can illustrate the same condition (e.g., no upstream breaker trip, similar fault location 502, among others), but for a 3-phase fault. In this example, due to the loss of voltage support from the non-faulted phases, as seen in the SLG fault no breaker trip line (e.g., line 516), the scores associated with the downstream metering devices 506 of line 514 may be higher compared to line 516, as the voltage on the metering device drops faster, for example. The various fault scenarios of graph 500C can be a subset of patterns historically generated or captured by one or more metering devices or the data processing system 202. Hence, the data processing system 202 can associate or compare a generated time series or normalized time series to at least one pattern (e.g., indicating the past location(s) of the fault(s)) to identify the fault location 502.

As shown in FIGS. 5A-C, the data processing system 202 can compare the generated time series to one or more patterns (e.g., representing different types of faults) to determine the fault location. In some cases, the data processing system 202 may determine that the fault location 502 is at a metering device or between two metering devices. In some cases, the data processing system 202 may determine that the fault location 502 is at a peak of the time series or normalized time series. In some other cases, the data processing system 202 may determine that the fault location 502 may not be at the peak of the generated time series. For example, based on at least one of the time period of the RMS signal used to calculate the derivative, type of fault, number of faulted phases, among other metrics, the predetermined patterns can indicate the behavior of the phase during the outage and the determined location of the fault. Hence, the data processing system 202 can compare a generated time series to one or more patterns to determine the fault location 502 relative to various metering devices in the electricity distribution grid.

Therefore, using the aforementioned techniques, the data processing system 202 can locate the epicenter of the outage among the metering devices that lost power or experienced outages. Thus, for an outage that affects metering devices over a large geographical area, for example, the data processing system 202 can reduce the time to locate the fault and restore utility service to customers, thereby increasing customer satisfaction of the services and improving the CAIDI score for the utility grid 100. In some cases, if the metering devices affected by the outage have accurate, high-resolution timestamp capability, the data processing system 202 can receive the timestamps when the voltage first fell below a threshold (e.g., 0.8 pu) from the metering devices, and determine the closest proximity to the fault indicated by the earliest timestamps received from the metering devices.

Figure 6:
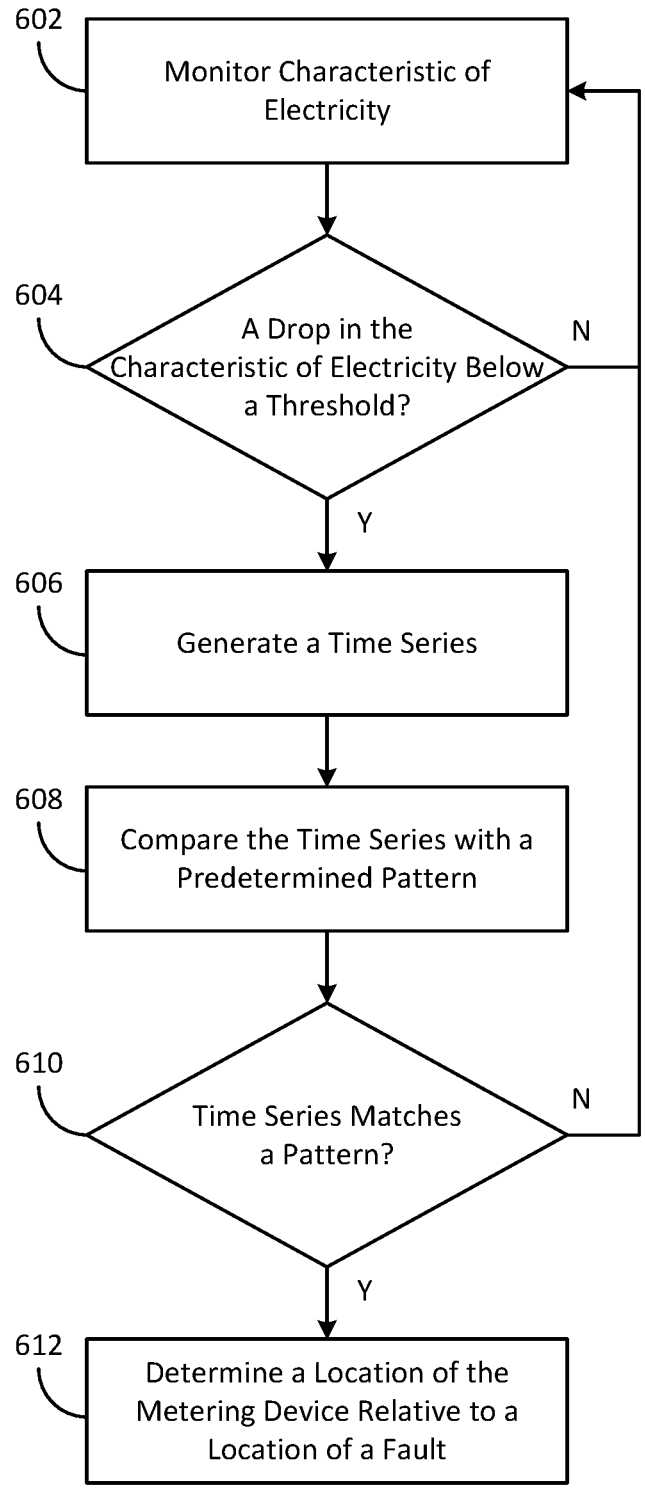
FIG. 6 is an example flow diagram of a method for locating a fault within a utility grid, in accordance with an implementation.

Referring to FIG. 6, an example flow diagram of a method 600 for locating a fault within a utility grid. The example method 600 can be executed, performed, or otherwise carried out by one or more components of the utility grid 100 (e.g., computing device, metering devices 118, etc.), the system 200 (e.g., data processing system 202, server 204, etc.), or computing device 700. The method 600 can include monitoring a characteristic of electricity, at ACT 602. At ACT 604, the method 600 can include determining whether a drop in the characteristic of electricity is below a threshold. At ACT 606, the method 600 can include generating a time series. At ACT 608, the method 600 can include comparing the time series with a predetermined pattern. At ACT 610, the method 600 can include determining whether the time series matches a pattern. At ACT 612, the method 600 can include determining a location of the metering device relative to a location of a fault.

Still referring to FIG. 6 in further detail, at ACT 602, a metering device (e.g., a data processing system) located on an electricity distribution grid can monitor a characteristic of electricity. The characteristic of electricity can include or refer to a waveform or RMS signal. The characteristic of electricity may correspond to at least one of a characteristic of voltage, current, power, etc. measured by the metering device. Other metering devices within the electricity distribution grid may perform one or more features, functionalities, or operations similar to the metering device, as discussed herein. The metering devices within the electricity distribution grid can communicate or share information with each other, thereby triangulating locations of individual metering devices relative to a fault location (e.g., identify locations of the metering devices with respect to the fault).

At ACT 604, the metering device can determine, based on the monitored characteristic of electricity, whether the characteristic of electricity (e.g., signal or waveform behavior) drops below a threshold. The threshold may be determined by the electrician, operator, or administrator of the metering device, the data processing system, or the electricity distribution grid, for example. In some cases, if the metering device does not detect the drop, the metering device can continue to monitor the electricity characteristic (e.g., return to ACT 602).

The metering device may detect a drop in the characteristic of electricity below the threshold. The drop can indicate a fault on the electricity distribution grid. For example, the metering device can determine that the RMS signal drops and sustains below the threshold for a predetermined timeframe (e.g., 0.5 µs, 0.25 µs, etc.). The metering device can detect the drop in response to the sustained signal below the threshold for the predetermined timeframe.

For example, responsive to detecting the signal dropping below the threshold, the metering device may start a PON timer (e.g., at PON start time). Subsequent to the predetermined timeframe, the metering device may end the timer (e.g., at PON end time). In this example, the metering device can detect the drop in the characteristic of electricity in response to the PON end. In some other cases, the metering device may detect the drop in the characteristic of electricity in response to the signal dropping below the threshold.

The metering device can trigger the PON (e.g., PON sending process) in response to detecting the drop in the characteristic of electricity. The PON can include at least the metering device ID and timestamps. The metering device (or other metering devices) can use the metering device ID to obtain information associated with the respective metering device ID, such as the measured waveform (e.g., voltage, current, etc.), RMS signal, among others. The timestamps may include at least a time when the characteristic of electricity drops below the threshold, PON start time, PON end time, etc. The metering device can send the PON to at least one other metering device to analyze the electricity characteristic during the drop. In some cases, the metering device may receive one or more PONs from other metering devices to process the behavior of the signal during the drop. In some cases, the metering device may simultaneously receive and send PON(s) from or to other metering devices.

At ACT 606, the metering device can generate a time series in response or subsequent to detecting a drop in electricity below the threshold. To generate the time series, the metering device can determine or compute the rate of change (e.g., metric) of the characteristic of electricity based on a derivative in time of RMS (e.g., RMS signal) of one of a voltage signal or a current signal, for example. The metering device can determine the derivative of the RMS for various other metering devices. The metering device can generate the time series of the rate of change of the characteristic of electricity for a predetermined number of cycles subsequent to the detection of the drop. The predetermined number of cycles may be preset or preconfigured by the operator of the electricity distribution grid or the metering device, for example. In some cases, the predetermined number of cycles can refer to the total number of metering devices affected by the outage. For instance, the metering device can determine the derivatives at or around the time of the drop for the various metering devices to generate the time series.

In some cases, the predetermined number of cycles can refer to the time duration or a number of waveform cycles after detecting the drop (e.g., at PON start time). For instance, the metering device may collect the signal behavior or computed rate of change from various metering devices affected by the fault for the predetermined time duration (e.g., until the respective PON end). The metering device can update the time series with the rate of change of the metering devices within the electricity distribution grid. Accordingly, in response to the predetermined number of cycles, the metering device can aggregate and generate the time series representative of the rate of change of the electricity behavior during an outage (e.g., at or around the PON start time) for the metering devices in the electricity distribution grid.

In some cases, the metering device can generate the time series for the predetermined number of cycles in response to the triggered PON. For example, the metering device may trigger PON responsive to a timeout of the PON timer (e.g., electricity sustained below the threshold). The metering device can receive, for the predetermined number of cycles, PONs from one or more other metering devices including at least one of the measured RMS, the rate of change, among others. Responsive to receiving the PON, the metering device can generate and update the time series with data from other metering devices. In some cases, the metering device can send information to at least one other metering device to generate the time series.

The time series can include a list or array of metering devices based on the location of the metering device with respect to a substation. For example, the metering device can list the metering devices in the x-axis of the time series from closest to farthest from the substation. In this example, the y-axis of the time series can include or indicate the magnitude of the rate of change in the characteristic of electricity or RMS. In some other cases, the location of the metering devices may be listed from farthest to closest to the substation.

At ACT 608, the metering device can compare the time series with at least one predetermined pattern. The predetermined pattern can include at least one of an incline slope, decline slope, zero slope, among others. In some cases, a declination of the decline slope may be greater than an inclination of the incline slope. In some other cases, the declination may be less than the inclination. In some other cases, the declination and the inclination may increase or decrease at a similar rate. The pattern may indicate the rate of changes (or lack of changes) of the incline or decline at different locations in the time series. The metering device can retrieve or obtain the predetermined pattern from a local data storage, remote data storage, or cloud storage. The pattern may be based on historical time series generated by the metering device or other metering devices. The pattern can indicate the historical fault location relative to the locations of the metering devices in the time series, such as marked, confirmed, or approved by the electrician fixing the power line or locating the fault.

At ACT 610, the metering device can determine whether the time series matches at least one of the patterns. For example, the metering device can identify portions of the time series with a first slope not trending to zero and a second slope trending to zero. The metering device can compare the inclination rate (e.g., of the first slope) and the declination of rate (e.g., of the second slope) to the rate of change of the slope in the pattern. In some cases, the inclination rate may be greater than the declination rate from closest to farthest metering devices from the substation. In some other cases, the inclination rate may be less than the declination rate. The pattern may indicate the type of fault experienced by the metering devices. In some cases, the pattern may indicate the one or more phases (e.g., of a 3-phase power) with a fault. Accordingly, the metering device can compare the behavior of the rate of change in the generated time series to the pattern to determine whether the two match.

If the pattern does not match, the metering device may continue to monitor the characteristic of electricity (e.g., return to step 602) to obtain additional electricity characteristics or generate another time series, for example. In some cases, the metering device may obtain additional patterns from cloud storage or local storage of another metering device for another comparison. If the pattern matches the behavior of the rate of change in the time series, the metering device can proceed to step 612 to determine the location of the fault.

At step 612, the metering device can determine the location of the metering device on the electricity distribution grid relative to the location of the fault (e.g., fault location) on the electricity distribution grid. The metering device can determine the relative location to the fault based on the comparison of the time series of the rate of change with the predetermined pattern. For example, the metering device can determine that the location of the metering device (e.g., the metering device performing the determination) is downstream a first subset of metering devices and upstream a second subset of metering devices based on the predetermined pattern. In this example, the incline slope in the time series or the pattern may be associated with the first subset of metering devices upstream of the metering device location. Further, the decline slope of the time series or the pattern may be associated with the second subset of metering devices downstream of the metering device location.

Based on the pattern, the metering device can detect that the fault location is at or near the metering device location. For instance, the pattern may indicate a fault location downstream the first subset of metering devices and upstream the second subset of metering devices. In another example, the pattern may indicate the fault location at or around the peak of the time series. The pattern may indicate the fault location at other points within the behavior of the time series (e.g., other metering devices locations). In some cases, the fault location may be in between two metering devices. For instance, the metering device can identify a second metering device having a similar rate of change or RMS behavior that is downstream the first subset of metering devices and upstream the second subset of metering devices. Based on a comparison with the pattern, the metering device can determine that the fault location is between the metering device location and the second metering device location.

The metering device can provide, via a network, an indication of the location of at least one of the second metering device or the fault location on the electricity distribution grid to a computing system comprising one or more processors coupled to memory. In some cases, the metering device can provide an indication of the metering device location relative to the fault to the computing system. The computing system may be operated by an electrician, operator, or administrator. For instance, responsive to receiving the indication, the operator may travel to the determined fault location to restore electricity to the metering devices (or metering devices downstream of the fault). In some cases, the metering device may provide the metering device location relative to the fault. In some other cases, based on the generated time series compared to the predetermined pattern, the metering device can determine that the fault is located at or near the second metering device (e.g., the second metering device). Accordingly, the metering device can provide the indication of the location of the second metering device (e.g., corresponding to the determined fault location) to the computing system of the operator.

In some cases, if the fault location is between a first metering device and a second metering device, the metering device may provide an indication of the location of the first metering device, the location of the second metering device, or both locations to the computing system. When providing the location of one metering device, such as a first metering device or a second metering device, the metering device may indicate whether the fault is determined to be downstream or upstream the respective metering device. For instance, if the first metering device is closer to the substation than the second metering device, and the fault is between the two metering devices, the metering device can indicate that the fault is downstream the first metering device or upstream the second metering device.

Further from the above example, the computing system can receive various time series of rates of change generated by metering devices located on the electricity distribution grid. The computing system can receive the time series responsive to drops in characteristics of electricity, such as experienced or detected by the individual metering devices. The computing system may normalize the values of the time series (e.g., normalize the rates of change) responsive to receiving the time series. The computing system can determine, based on the normalized values of the plurality of time series, a likelihood of fault location at each of the metering devices (e.g., each metering device location). For example, the normalized rates of changes of the various metering devices can correspond to or represent the likelihood of fault location represented as a percentage, value, character, grade (e.g., A-F), among other ratings. Based on the likelihood, the computing system can determine that the fault is located upstream of at least a first metering device and downstream of at least a second metering device.

In some cases, the computing system may determine that the fault is next to the substation (e.g., upstream the metering devices on the electricity distribution grid) based on the likelihood. In some other cases, the computing system may determine that the fault is near or at the end of the power line (e.g., downstream metering devices on the electricity distribution grid, upstream the metering device farthest from the substation). In some cases, the computing system can correspond to, include, or be a part of the data processing system.

In some cases, the electricity distribution grid can include a second metering device located at a different location from the metering device. The second metering device can perform one or more features or functionalities similar to the metering device or the data processing system to determine the location of the second metering device relative to the fault location. For example, the second metering device can detect a second drop in the characteristic of electricity below the threshold indicating the fault (e.g., the same fault detected by the first metering device) on the electricity distribution grid. The second metering device can generate a second time series of a second rate of change of the characteristic of electricity responsive to the second drop in the characteristic of electricity below the threshold. The second metering device can generate the second time series for the predetermined number of cycles subsequent to the detection of the second drop. The second metering device can compare the second time series to the predetermined pattern (or another predetermined pattern). The second metering device can determine, based on the comparison (e.g., a second comparison) of the second time series of the second rate of change with the predetermined pattern, a location of the second metering device on the electricity distribution grid relative to the location of the fault on the electricity distribution grid. Accordingly, the second metering device can provide an indication of the second metering device location or the fault location to the computing system.

FIG. 7 is a block diagram of an example computer system 700. The computer system or computing device 700 can include or be used to implement the data processing system 202, or its components such as the data processing system 202. The computing system 700 includes at least one bus 705 or other communication component for communicating information and at least one processor 710 or processing circuit coupled to the bus 705 for processing information. The computing system 700 can also include one or more processors 710 or processing circuits coupled to the bus for processing information. The computing system 700 also includes at least one main memory 715, such as a random access memory (RAM) or other dynamic storage device, coupled to the bus 705 for storing information, and instructions to be executed by the processor 710. The main memory 715 can also be used for storing position information, utility grid data, command instructions, device status information, environmental information within or external to the utility grid, information on characteristics of electricity, or other information during execution of instructions by the processor 710. The computing system 700 may further include at least one read only memory (ROM) 720 or other static storage device coupled to the bus 705 for storing static information and instructions for the processor 710. A storage device 725, such as a solid state device, magnetic disk or optical disk, can be coupled to the bus 705 to persistently store information and instructions.

The computing system 700 may be coupled via the bus 705 to a display 765, such as a liquid crystal display, or active matrix display, for displaying information to a user such as an administrator of the data processing system or the utility grid. An input device 760, such as a keyboard or voice interface may be coupled to the bus 705 for communicating information and commands to the processor 710. The input device 760 can include a touch screen display 765. The input device 760 can also include a cursor control, such as a mouse, a trackball, or cursor direction keys, for communicating direction information and command selections to the processor 710 and for controlling cursor movement on the display 765. The display 765 can be part of the data processing system 202, or other component of FIG. 1 or FIG. 2.

The processes, systems and methods described herein can be implemented by the computing system 700 in response to the processor 710 executing an arrangement of instructions contained in main memory 715. Such instructions can be read into main memory 715 from another computer-readable medium, such as the storage device 725. Execution of the arrangement of instructions contained in main memory 715 causes the computing system 700 to perform the illustrative processes described herein. One or more processors in a multi-processing arrangement may also be employed to execute the instructions contained in main memory 715. Hard-wired circuitry can be used in place of or in combination with software instructions together with the systems and methods described herein. Systems and methods described herein are not limited to any specific combination of hardware circuitry and software.

Although an example computing system has been described in FIG. 7, the subject matter including the operations described in this specification can be implemented in other types of digital electronic circuitry, or in computer software, firmware, or hardware, including the structures disclosed in this specification and their structural equivalents, or in combinations of one or more of them.

Some of the descriptions herein emphasize the structural independence of the aspects of the system components (e.g., arbitration component) and illustrate one grouping of operations and responsibilities of these system components. Other groupings that execute similar overall operations are understood to be within the scope of the present application. Modules can be implemented in hardware or as computer instructions on a non-transient computer-readable storage medium, and modules can be distributed across various hardware- or computer-based components.

The systems described above can provide multiple ones of any or each of those components and these components can be provided on either a standalone system or on multiple instantiation in a distributed system. In addition, the systems and methods described above can be provided as one or more computer-readable programs or executable instructions embodied on or in one or more articles of manufacture. The article of manufacture can be cloud storage, a hard disk, a CD-ROM, a flash memory card, a PROM, a RAM, a ROM, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

Example and non-limiting module implementation elements include sensors providing any value determined herein, sensors providing any value that is a precursor to a value determined herein, datalink or network hardware including communication chips, oscillating crystals, communication links, cables, twisted pair wiring, coaxial wiring, shielded wiring, transmitters, receivers, or transceivers, logic circuits, hard-wired logic circuits, reconfigurable logic circuits in a particular non-transient state configured according to the module specification, any actuator including at least an electrical, hydraulic, or pneumatic actuator, a solenoid, an op-amp, analog control elements (springs, filters, integrators, adders, dividers, gain elements), or digital control elements.

The subject matter and the operations described in this specification can be implemented in digital electronic circuitry, or in computer software, firmware, or hardware, including the structures disclosed in this specification and their structural equivalents, or in combinations of one or more of them. The subject matter described in this specification can be implemented as one or more computer programs, e.g., one or more circuits of computer program instructions, encoded on one or more computer storage media for execution by, or to control the operation of, data processing apparatuses. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. While a computer storage medium is not a propagated signal, a computer storage medium can be a source or destination of computer program instructions encoded in an artificially generated propagated signal. The computer storage medium can also be, or be included in, one or more separate components or media (e.g., multiple CDs, disks, or other storage devices include cloud storage). The operations described in this specification can be implemented as operations performed by a data processing apparatus on data stored on one or more computer-readable storage devices or received from other sources.

The terms "computing device", "component" or "data processing apparatus" or the like encompass various apparatuses, devices, and machines for processing data, including by way of example a programmable processor, a computer, a system on a chip, or multiple ones, or combinations of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, app, script, or code) can be written in any form of programming language, including compiled or interpreted languages, declarative or procedural languages, and can be deployed in any form, including as a stand-alone program or as a module, component, subroutine, object, or other unit suitable for use in a computing environment. A computer program can correspond to a file in a file system. A computer program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatuses can also be implemented as, special purpose logic circuitry, e.g., an FPGA (field programmable gate array) or an ASIC (application specific integrated circuit). Devices suitable for storing computer program instructions and data can include non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The subject matter described herein can be implemented in a computing system that includes a back end component, e.g., as a data server, or that includes a middleware component, e.g., an application server, or that includes a front end component, e.g., a client computer having a graphical user interface or a web browser through which a user can interact with an implementation of the subject matter described in this specification, or a combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While operations are depicted in the drawings in a particular order, such operations are not required to be performed in the particular order shown or in sequential order, and all illustrated operations are not required to be performed. Actions described herein can be performed in a different order.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation.

Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

The systems and methods described herein may be embodied in other specific forms without departing from the characteristics thereof. Scope of the systems and methods described herein is thus indicated by the appended claims, rather than the foregoing description, and changes that come within the meaning and range of equivalency of the claims are embraced therein.

While this specification contains many specific implementation details, these should not be construed as limitations on the scope of any inventions or of what can be claimed, but rather as descriptions of features specific to particular embodiments of particular aspects. Certain features described in this specification in the context of separate embodiments can also be implemented in combination in a single embodiment. Conversely, various features described in the context of a single embodiment can also be implemented in multiple embodiments separately or in any suitable subcombination. Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the embodiments described above should not be understood as requiring such separation in all embodiments, and it should be understood that the described program components and systems can generally be integrated in a single software product or packaged into multiple software products.

Thus, particular embodiments of the subject matter have been described. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. A method, comprising:
   detecting, by a metering device comprising memory and one or more processors and located on an electricity distribution grid, a drop in electricity below a threshold indicating a fault on the electricity distribution grid;
   generating, by the metering device responsive to the drop in the electricity below the threshold, a time series of a rate of change of the electricity for a predetermined number of cycles subsequent to the detection of the drop; and
   determining, by at least one of the metering device or a computing device in communication with the metering device, based on a comparison of the time series of the rate of change with a predetermined pattern, a location of the metering device on the electricity distribution grid relative to a location of the fault on the electricity distribution grid.

2. The method of claim 1, wherein the drop in the electricity corresponds to a drop in voltage measured by the metering device.

3. The method of claim 1, wherein the drop in the electricity corresponds to a drop in current measured by the metering device.

4. The method of claim 1, comprising:
   triggering, by the metering device, responsive to the detected drop in the electricity, a power outage notification (PON); and
   generating, by the metering device, responsive to the triggered PON, the time series of the rate of change of the electricity for the predetermined number of cycles.

5. The method of claim 1, comprising:
   determining, by the metering device, the rate of change of the electricity based on a derivative in time of a root mean square (RMS) of one of a voltage signal or a current signal.

6. The method of claim 1, wherein the predetermined pattern comprises at least an incline slope and a decline slope, wherein a declination of the decline slope is greater than an inclination of the incline slope.

7. The method of claim 6, comprising:
   determining, by the metering device, that the location of the metering device is downstream a first subset of metering devices and upstream a second subset of metering devices based on the predetermined pattern, wherein the incline slope is associated with the first subset of metering devices upstream of the location of the metering device, and wherein the decline slope is associated with the second subset of metering devices downstream of the location of the metering device.

8. The method of claim 1, wherein the electricity distribution grid comprises a second metering device located at a different location from the metering device, comprising:
   detecting, by the second metering device, a second drop in the electricity below the threshold indicating the fault on the electricity distribution grid;

generating, by the second metering device responsive to the second drop in the electricity below the threshold, a second time series of a second rate of change of the electricity for the predetermined number of cycles subsequent to the detection of the second drop; and determining, by the second metering device, based on a second comparison of the second time series of the second rate of change with the predetermined pattern, a location of the second metering device on the electricity distribution grid relative to the location of the fault on the electricity distribution grid.

9. The method of claim 8, comprising:
providing, by the metering device, via a network, an indication of the location of at least one of the second metering device or the fault on the electricity distribution grid to a computing system comprising a second one or more processors coupled to a second memory.

10. The method of claim 1, comprising:
receiving, by a computing system, a plurality of time series of rates of change generated by a plurality of metering devices located on the electricity distribution grid responsive to drops in electricity;
normalizing, by the computing system, values of the plurality of time series;
determining, by the computing system, based on the normalized values of the plurality of time series, a likelihood of fault location at each of the plurality of metering devices; and
determining, by the computing system, that the fault is upstream of a first metering device and downstream of a second metering device based on the likelihood.

11. A system, comprising:
a metering device located on an electricity distribution grid, the metering device comprising one or more processors and memory to:
detect a drop in electricity below a threshold indicating a fault on the electricity distribution grid;
generate, responsive to the drop in the electricity below the threshold, a time series of a rate of change of the electricity for a predetermined number of cycles subsequent to the detection of the drop; and
determine, based on a comparison of the time series of the rate of change with a predetermined pattern, a location of the metering device on the electricity distribution grid relative to a location of the fault on the electricity distribution grid.

12. The system of claim 11, wherein the drop in the electricity corresponds to a drop in voltage measured by the metering device.

13. The system of claim 11, wherein the drop in the electricity corresponds to a drop in current measured by the metering device.

14. The system of claim 11, wherein the one or more processors to:
trigger, responsive to the detected drop in the electricity, a power outage notification (PON); and
generate, responsive to the triggered PON, the time series of the rate of change of the electricity for the predetermined number of cycles.

15. The system of claim 11, wherein the one or more processors to:
determine, the rate of change of the electricity based on a derivative in time of a root mean square (RMS) of one of a voltage signal or a current signal.

16. The system of claim 11, wherein the predetermined pattern comprises at least an incline slope and a decline slope, wherein a declination of the decline slope is greater than an inclination of the incline slope.

17. The system of claim 16, wherein the one or more processors to:
determine that the location of the metering device is downstream a first subset of metering devices and upstream a second subset of metering devices based on the predetermined pattern, wherein the incline slope is associated with the first subset of metering devices upstream of the location of the metering device, and wherein the decline slope is associated with a second metering device downstream of the location of the metering device.

18. The system of claim 11, wherein the electricity distribution grid comprises a second metering device located at a different location from the metering device, the second metering device configured to:
detect a second drop in the electricity below the threshold indicating the fault on the electricity distribution grid;
generate, responsive to the second drop in the electricity below the threshold, a second time series of a second rate of change of the electricity for the predetermined number of cycles subsequent to the detection of the second drop; and
determine, based on a second comparison of the second time series of the second rate of change with the predetermined pattern, a location of the second metering device on the electricity distribution grid relative to the location of the fault on the electricity distribution grid.

19. A non-transitory computer readable storage medium storing instructions that, when executed by one or more processors of a computing system, cause the one or more processors to:
receive a plurality of time series of rates of change generated by a plurality of metering devices located on an electricity distribution grid responsive to drops in electricity;
normalize values of the plurality of time series;
determine, based on the normalized values of the plurality of time series, a likelihood of fault location at each of the plurality of metering devices;
determine that a fault is upstream of a first metering device and downstream of a second metering device based on the likelihood; and
provide, responsive to the determination, an indication of a location of the fault upstream of the first metering device and downstream of the second metering device.

20. The non-transitory computer readable storage medium of claim 19, wherein to provide the indication comprises instructions to provide the indication of the location of the fault to a device remote from the computing system to facilitate repair of the fault.

* * * * *